(12) United States Patent
Butz

(10) Patent No.: US 6,462,977 B2
(45) Date of Patent: Oct. 8, 2002

(54) DATA STORAGE DEVICE HAVING VIRTUAL COLUMNS AND ADDRESSING LAYERS

(76) Inventor: David Earl Butz, 532 Longley Rd., Groton, MA (US) 01450

( * ) Notice: Subject to any disclaimer, the term of this patent is extended or adjusted under 35 U.S.C. 154(b) by 0 days.

(21) Appl. No.: 09/851,887

(22) Filed: May 9, 2001

(65) Prior Publication Data

US 2002/0041525 A1 Apr. 11, 2002

Related U.S. Application Data

(60) Provisional application No. 60/226,100, filed on Aug. 17, 2000.

(51) Int. Cl.[7] .................................................. G11C 5/06
(52) U.S. Cl. ........................ 365/63; 365/51; 365/230.01
(58) Field of Search ............................... 365/51, 63, 64, 365/149, 230.01

(56) References Cited

U.S. PATENT DOCUMENTS

| | | | |
|---|---|---|---|
| 4,032,962 A | 6/1977 | Balyoz et al. ............... 257/204 |
| 4,377,849 A | 3/1983 | Finger et al. .................... 716/7 |
| 4,780,846 A | 10/1988 | Tanabe et al. ................. 365/63 |
| 4,782,465 A | 11/1988 | Uchida ......................... 365/72 |
| 4,954,480 A | 9/1990 | Imanaka et al. ............. 505/220 |
| 4,989,062 A | 1/1991 | Takahashi et al. ........... 257/207 |
| 5,023,837 A | * 6/1991 | Schreck et al. ......... 365/185.16 |
| 5,025,299 A | 6/1991 | Arnould ...................... 257/207 |
| 5,047,825 A | 9/1991 | Yasaka et al. ............... 257/369 |
| 5,063,430 A | 11/1991 | Mori ........................... 257/202 |
| 5,132,571 A | 7/1992 | McCollum et al. ........... 326/41 |
| 5,237,184 A | 8/1993 | Yonemaru et al. ........... 257/202 |
| 5,245,205 A | 9/1993 | Higasitani et al. .......... 257/296 |
| 5,264,390 A | 11/1993 | Nagase et al. ............... 438/599 |
| 5,294,820 A | 3/1994 | Gemma et al. .............. 257/324 |
| 5,300,814 A | 4/1994 | Matsumoto et al. ......... 257/758 |
| 5,319,229 A | 6/1994 | Shimoji et al. .............. 257/324 |
| 5,321,280 A | 6/1994 | Sakai ........................... 257/211 |
| 5,357,140 A | 10/1994 | Kozasa ........................ 257/752 |
| 5,365,091 A | 11/1994 | Yamagishi ................... 257/203 |
| 5,371,390 A | 12/1994 | Mohsen ....................... 257/209 |
| 5,391,914 A | 2/1995 | Sullivan et al. ............. 257/635 |
| 5,399,517 A | 3/1995 | Ashtaputre et al. ......... 438/598 |
| 5,401,989 A | 3/1995 | Kikuchi ....................... 257/211 |
| 5,440,153 A | 8/1995 | Male et al. .................. 257/204 |
| 5,459,355 A | 10/1995 | Kreifels ....................... 257/758 |
| 5,493,135 A | 2/1996 | Yin .............................. 257/204 |
| 5,504,354 A | 4/1996 | Mohsen ....................... 257/209 |
| 5,510,636 A | 4/1996 | Murata ........................ 257/206 |
| 5,554,867 A | 9/1996 | Ajika et al. ................. 257/314 |
| 5,612,552 A | 3/1997 | Owens ........................ 257/202 |
| 5,623,160 A | * 4/1997 | Liberkowski ............... 257/621 |
| 5,631,478 A | 5/1997 | Okumura ..................... 257/211 |
| 5,654,564 A | 8/1997 | Mohsen ....................... 257/209 |
| 5,734,187 A | 3/1998 | Bohr et al. .................. 257/377 |
| 5,745,407 A | 4/1998 | Levy et al. .................. 364/159 |

(List continued on next page.)

FOREIGN PATENT DOCUMENTS

| JP | 63-228500 | * 9/1988 | ........... G11C/29/00 |
|---|---|---|---|
| JP | 6-120359 | * 4/1994 | ........... H01L/21/90 |

OTHER PUBLICATIONS

Service, Robert F., "Electrical Engineering–New Memory Cell Could Boost Computer Speeds," *Science*, May 28, 1999, page 1444, vol. 284.

(List continued on next page.)

*Primary Examiner*—Andrew Q. Tran
(74) *Attorney, Agent, or Firm*—Wolf, Greenfield and Sacks, P.C.

(57) ABSTRACT

A memory device is disclosed. The memory device includes, in some embodiments, a plurality of virtual columns that may be addressed by applying an address to a plurality of address layers of the memory device. The virtual columns include addressable elements coupled to the address layers. The addressable elements allow for a data storage element associated with the virtual columns to be accessed for read/write operations when each addressable element receives a particular signal as an input from the address layer to which it is coupled.

60 Claims, 23 Drawing Sheets

U.S. PATENT DOCUMENTS

| | | | |
|---|---|---|---|
| 5,780,883 A | | 7/1998 | Tran et al. .................. 257/206 |
| 5,789,776 A | | 8/1998 | Lancaster et al. ........... 257/296 |
| 5,812,474 A | * | 9/1998 | Lawrence et al. ........... 365/201 |
| 5,912,852 A | * | 6/1999 | Lawrence et al. ........... 365/201 |
| 5,914,902 A | * | 6/1999 | Lawrence et al. ........... 365/201 |
| 5,987,574 A | * | 11/1999 | Paluch ....................... 711/158 |
| 5,995,424 A | * | 11/1999 | Lawrence et al. ........... 365/201 |
| 2002/0041525 A1 | * | 4/2002 | Butz .......................... 365/200 |

OTHER PUBLICATIONS

Chin, Gilbert, "Editors Choice–Chemistry, Induced Fit in a Molecular Pac–Man," *Science,* Feb. 4, 2000, page 769, vol. 287.

Lent, Craig, "Perspectives: Molecular Electronics, Bypassing the Transistor Paradigm,"*Science*, Jun. 2, 2000.

Szuromi, Phil, "This Week in Science: Toward Mechanical Carbon Nanotube Memories, "*Science,* Jul. 7, 2000, page 9, vol. 289.

Reed, Mark A. and Tour, James M., "Computing With Molecules, "*Scientific American,* June 2000, pp. 86–93.

Chin, Gilbert, "Editors Choice –Materials Science: A Nanoarea Network,"*Science*, Jun. 30, 2000, p. 2285, vol. 288.

* cited by examiner

DATA STORAGE DEVICE HAVING VIRTUAL COLUMNS AND ADDRESSING LAYERS

RELATED APPLICATIONS

This application claims the benefit under 35 U.S.C. §119 (e) of provision application No. 60/226,100, filed Aug. 17, 2000, titled System and Methods for Addressing a Matrix, which is incorporated herein by reference.

BACKGROUND

1. Field of the Invention

The present invention relates generally to methods and apparatus for providing a matrix of uniquely addressable locations and, more particularly, to devices that may store data in a matrix of uniquely addressable locations that may be addressed using a reduced number of address bits.

2. Related Art

Several types of devices require unique locations to be addressed. Examples of these include, but are not limited to, devices that present data such as video displays, devices that may receive and record matrix data such as imaging arrays, and devices that may interconnect internally such as logic arrays. Another type of device, a conventional disk drive, also requires unique locations to be addressed. Conventional disk drives require mechanical manipulation of the disk to access data in a particular location.

Still another type of device which requires unique locations to be addressed is a device which may store and receive data such as a computer memory. Various portions of the following discussion will deal with memory devices such as computer memories. However, the teachings herein are not limited in this respect and may be applied to any type of device that requires unique addressing.

In the context of computer memories, since the advent of the first computer, it has been realized that memory devices for storing information are an essential element of a working computer. Many types of memories for computers have been developed, such as read-only memories (ROMs) and random-access memories (RAMs) as well as magnetic and optical data storage disks. These memories are accessed for read/write operations by the central processing unit (CPU) of the computer.

As computers have gotten smaller and faster, computer and memory unit designers have recognized that their memory devices likewise need to be smaller and operate faster. This has led to very competitive research and development of smaller, faster memory units.

The basic structure upon which present computer memories are based is the row/column array configuration. This structure has been very useful, not only in the field of computer memories but also as a model for conceptually dealing with data structures in the computer science art.

FIG. 1 is an example of a prior art memory array 1. The memory array 1 includes several row address lines 2 and column address lines 3. A memory cell is typically located at the intersection of a row address line and a column address line. The memory cells are used to store information, typically digital information. Examples of memory cells are a capacitor, a transistor device, a flip-flop, or an optical data storage device. As is well known, some memory cells store only a single bit while other types may be capable of storing a block of data such as typically referred to as a "word" or "byte".

In order to access a particular memory cell in the memory array 1, the CPU (not shown) must access both the row and the column corresponding to the location of the memory cell in the array. This entails sending a memory location address from the CPU to the memory array 1. The address is then decoded by conventional means such as a multiplexer, and the correct memory cell of interest is then accessed. Thus, the location of each memory cell may be represented as $n_{r,c}$ where the r and c represent the row and column, respectively (with the first row and column being denoted as "0" as is conventional).

For example, in the 8×8 memory array 1, if the CPU desired access to the memory cell at the intersection of the third row and the eighth column ($n_{2,7}$) the CPU would have to send a binary row address of 010 to the row decoder 4 and a binary column address of 111 to the column decoder 5. The row decoder 4 and column decoder 5 are typically implemented as multiplexers. The row decoder 4 converts the three bit row input to a binary representation of 00000100. This output is then transferred to the memory array 1 through hard wired connections between the output of the row decoder 4 and the memory array 1. Thus, in order to access each row of the 8×8 memory array 1, eight physical line connections (as well as the requisite multiplexer) must be included with the memory array 1. Similarly, the column decoder 5 receives the address 111 and converts it to 10000000 leading to an additional 8 lines (and a second multiplexer) to be connected to the memory array 1. Thus, a total of 16 physical line connections and two decoders are required in order to access each and every cell of the 8×8 memory array 1. The interconnections and decoders require space on an integrated chip and therefore serve as a bottleneck when trying to reduce the physical size occupied by the memory array 1 and its supporting hardware.

When a memory array is configured in the manner described above, the number of address bits required to access the particular memory is determined by the size of the memory array. For example, addressing for a 64 cell, 8×8 memory array 1 requires at least 6 bits, 3 for the row and 3 for the column. Thus, an inherent relationship exists in essentially all conventional memory devices between the requisite number of address bits and the number of memory cells in the memory array 1 as shown in equation (1):

$$\text{addresses} = 2^n \qquad (1)$$

where n is the number of address bits. However, this equation is deceiving; it represents the number of bits the CPU must "send out" in order to access a particular memory cell of the memory array 1. In actuality, the number of address bits received by the memory array 1 is equal to the number of physical line connections to the memory array 1 as discussed above. Thus, for the 8×8 array discussed above, the memory array 1 actually receives 16 address bits. This is more than double the number of address bits needed to represent each of the memory cells of the array. The transmission of these extra bits requires additional wiring and thus, increases the size and complexity of memory arrays.

Thus, for a square array containing $2^n$ memory cells, $2 \times 2^{n/2}$ lines (i.e., $2^{n/2}$ columns and $2^{n/2}$ rows) must be supplied to and embedded within the array. For example, for an array of 4096 bits (i.e., $2^{12}$), 128 (i.e., $2 \times 2^6$) lines are necessary, even though the lower limit of binary addresses required from the CPU is only 12—a full order of magnitude less than the row column scheme requires. This disparity grows exponentially as the array grows in size.

Other issues related to the amount of wiring required in conventional memory devices include the complex topology necessitated by the perpendicular passage of row and column lines past one another to reach their respective connections to the cell.

In addition to the size constraints imposed by the extra wiring of a memory array, implementing a memory unit as a two-dimensional array also has other size constraints. For instance, the physical layout of the memory unit imposes a size limitation. As the amount of memory needed has increased, many novel approaches for how to layout the memory device have been developed. For example, stacking the memory units on top of one another has been proposed. This allows for an increase in memory by increasing the volume of the memory unit without increasing the amount of surface area on a computer's mother board taken up by the memory. However, as the physical dimensions of computers have decreased, so has the available volume. Traditionally, each memory array in the stacked memory device must be individually addressed, which requires more hard wiring and address bits. Conceptually, each memory cell has a location of $X_{r,c,l}$ were r, c, and l are the row, column and layer, respectively of the stacked type of memory device. A novel approach to reducing the size of such a memory is disclosed in U.S. Pat. No. 5,623,160 where interconnections between the layers of integrated circuits are conducted by vertical pillars extending from a bottom layer to a top layer. Also, several devices have attempted to reduce the size of the memory device by various types of interconnection techniques to reduce the amount of space required to provide power and ground connections to each layer of the stacked memory device.

The memory devices of the prior art were typically rigid integrated chips. At times, when repairing or modifying the internal configuration of the computer, an integrated chip could be cracked or broken. Further, having the memory device placed on an integrated chip severely limited the shape the memory device could take. For example, a memory array configured in the row/column manner somewhat predisposes the chips to take on a square shape (See e.g., FIG. 1). While the rows and columns may intersect one another at angles other than right angles, the space constraints of the memory cell which actually holds the data must fit and be connectable to the rows and columns, and this limits the row/column configuration.

In addition, there is a lower size limit dictated by the total perimeter necessary to accommodate all interconnections from all lines of the memory array to external devices. For example, with the 4096 bit array described above, the total perimeter is equal to roughly 128×P, where P is the so called "pitch distance" required between bonding pads. Thus one side of the square array is approximately (128×P/4) in length and the area of the array can be no less than (128×P/4)². Since bonding pads must be large enough to accommodate ordinary wires, P is a number which cannot be reduced into the microscopic range. Therefore, even if the memory array itself is reduced to a miniscule area, the overall package cannot be reduced beyond the size dictated by the lower limits of perimeter length. In actuality, the perimeter is even greater than described above since additional grounding lines must be regularly interspersed amongst the signal lines to control inter-line capacitive interference.

The typical row/column configuration may also have inherent signal propagation delays because a signal must traverse the long narrow conduction pathways established in the memory array before it is read out.

Another source of delay may come in the form of a stabilization timing delay which is inherent in a conventional row/column accessing scheme. Typically, to access a particular memory cell, the column is addressed, allowed to stabilize, and then the row is addressed and allowed to stabilize. The timing of the stabilization has received a great deal of attention as it is related to clock cycles with various conventional schemes.

SUMMARY

Aspects and embodiments of the present invention may overcome some or all of the above and other drawbacks to conventional addressing arrangements. Some embodiments of the present invention are directed to memory units/data storage devices. In these embodiments, aspects of the present invention include both methods and apparatus that enable access to and from a data storage device requiring significantly fewer actual address bits. In addition, some embodiment may significantly reduce the propagation delays inherent in current memory devices. In some embodiments, the devices do not need to store data and only the methods and systems for addressing uniquely addressable locations disclosed herein need be applied.

In one aspect of the present invention, a data storage device is disclosed. This aspect includes at least one addressing layer and at least one virtual column having at least one data storage element and a plurality of addressable switch elements. The at least one virtual column is coupled to the at least one addressing layer such that at least one of the plurality of addressable switch elements is in a conductive relationship with the at least one addressing layer.

In another aspect of the present invention, a device for storing data that includes at least one virtual column, at least one read layer coupled to a first portion of the virtual column and at least one addressing layer coupled to a second portion of the virtual column is disclosed.

In another aspect, a data storage device comprising a plurality of virtual columns is disclosed. In this aspect, each of the virtual columns includes an addressable switch element and a data storage element. This aspect also includes, surrounding the addressable switch element, a material adapted to transmit a signal to the addressable switch element.

In another aspect, a data storage device is disclosed. In this aspect the device includes a plurality of memory devices, each containing data storage elements, configured such that each data storage element contained in each memory device is accessible for read/write operations by presenting an address of the data storage element to a plurality of laminar layers contained in the device. In this aspect, each memory device includes a plurality of external access lines associated with a respective one of the plurality of laminar layers. This aspect also includes a plurality of external bus bars, that is associated with at least one of the plurality of external access lines.

In another aspect, a memory device that includes a first strip of non-conductive material and a first plurality of virtual columns disposed on the first strip is disclosed.

In another aspect, a memory device comprising a substrate and a plurality of virtual columns arranged into sections on the substrate is disclosed. In this aspect, each section including a plurality of address lines coupled to portions of the virtual columns. This aspect also includes a plurality of external access lines coupled to the address lines.

In another aspect of the present invention, a method of accessing data in a data storage device having a plurality of layers is disclosed. The method of this aspect includes steps of (a) determining an address of a data bit to be accessed, and (b) applying a voltage to the plurality of address layers, wherein the voltage applied to the plurality of address layers corresponds to a logic state of a particular bit expressed by a binary representation of the address.

In another aspect, a method of accessing data in a data storage device having a plurality of layers is disclosed. The method of this aspect includes steps of: (a) determining an address of a data bit to be accessed, and (b) applying a voltage to the plurality of address layers, where the voltage applied to each address layer corresponds to a logic state of a particular bit expressed by the binary representation of the address.

BRIEF DESCRIPTION OF THE DRAWINGS

Aspects of the present invention are pointed out with particularity in the appended claims. Various aspects and embodiments of the present invention may be better understood by referring to the following description when taken in conjunction with the accompanying drawings, in which:

FIG. 6b is a more detailed depiction of the addressable switch elements shown in FIG. 6a;

FIG. 19b shows a more detailed view of a single memory device which may be used in the embodiment of FIG. 19a.

DETAILED DESCRIPTION

Aspects and embodiments of the present invention are related to matrices of uniquely addressable locations. In some embodiments these matrices are applied in the context of memory devices that have data storage elements that are addressable using a small number of address bits and that reduce or eliminate the need for an interface such as a multiplexer between the CPU (or other controlling device) and the memory device. The memory device of these embodiments may include a plurality of virtual columns. As used herein, and described in greater detail below, a virtual column is a construct that includes a plurality of addressable switch elements (or "switch elements") that are used to uniquely address each virtual column. In some embodiments, the switch elements may be serially connected to form the virtual column.

In some embodiments, the virtual column may also be associated with or include at least one data storage element for storing a block (e.g., a word or a bit) of data. However, the virtual column does not require a data storage element in all embodiments. For instance, the virtual column may not be associated with a data storage element in embodiments that do not require data storage.

Virtual Columns

Figure 1:
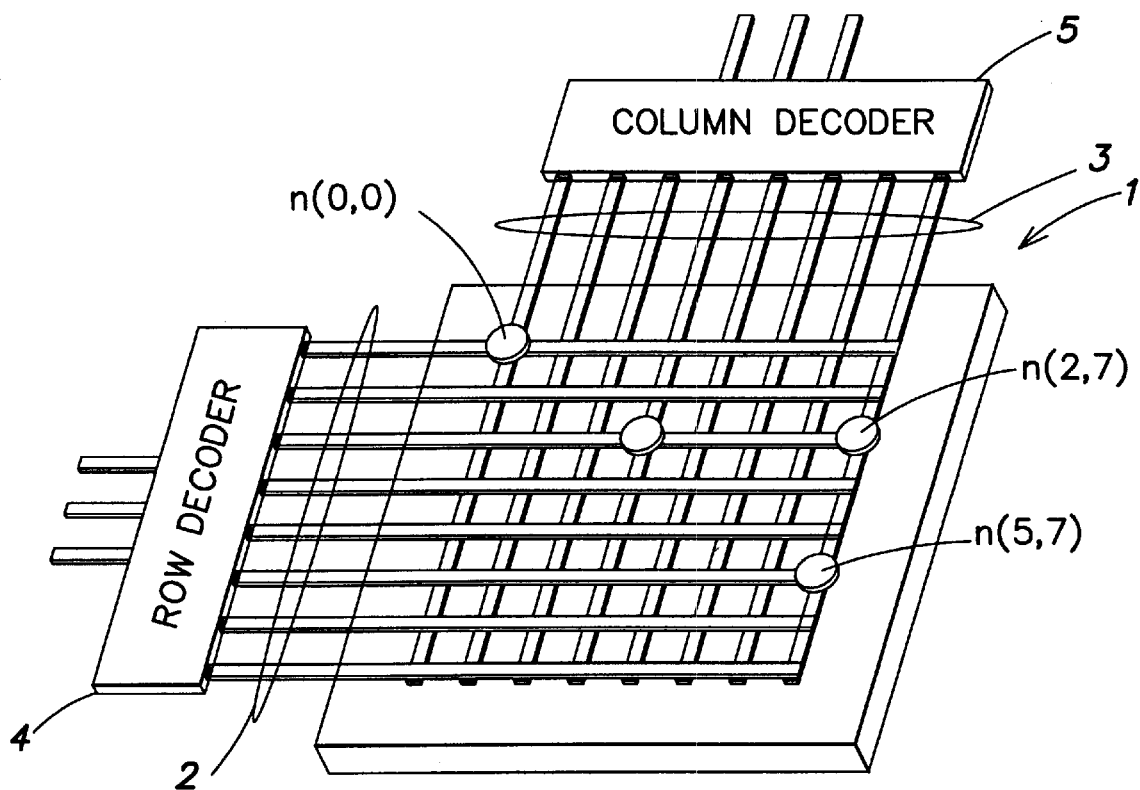
FIG. 1 is an example of a prior art memory array.
Figure 2:
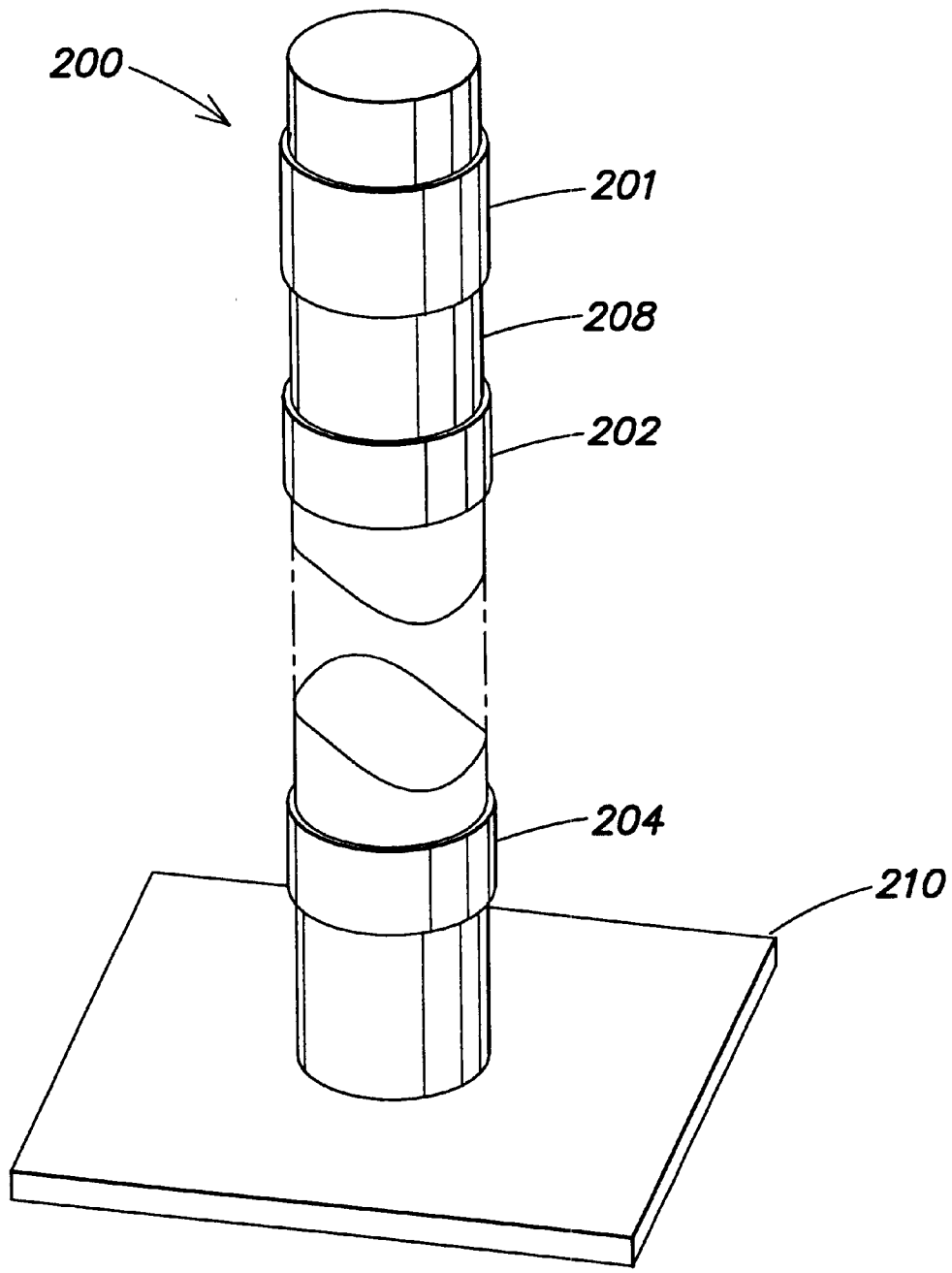
FIG. 2 is an example of one embodiment of a virtual column which may be used in some embodiments of the present invention.

FIG. 2 shows an example of a virtual column 200. The virtual column 200, for example, includes two addressable switch elements 202 and 204. However, the virtual column 200 may contain any number of addressable switch elements. As discussed below, the addressable switch elements define the unique address of the virtual column 200. The number of addressable switch elements in each virtual column may be correlated to the number of discrete addresses a data storage device may contain. In one embodiment, if there are "n" addressable switch elements per virtual column, then there are $2^n$ possible addresses.

The addressable switch elements of the virtual column 200 may be coupled (either electrically, optically or by other means) together by what shall be referred to herein as "feed-throughs." The feed-throughs 208 serve, in combination with the addressable switch elements, as pathways through virtual column 200 for passage of signals therethrough. In some embodiments, signals may be passed to or from a data storage element when the virtual column 200 becomes conductive. However, as discussed above, the virtual column 200 need not include a data storage element 201 in applications where data storage is not needed. For instance, the columnar addressing techniques described herein could be applied to applications such as video displays, video imaging systems, sensor arrays, and logical processors which are "real time" and, therefore, do not require data storage.

If present, the data storage element 201 may be any type of element which is capable of storing data. For instance, in a computer, all data values are stored as ones and zeros and correspond to voltages that are set to a high value (a one) or a lower value (a zero). The virtual column 200 may also include or be associated with one or more data storage elements 201. Elements capable of storing such values are well known in the art and may include, but are not limited to, capacitive elements, transistors, and transistor based devices such as latches or flip flops, magnetic devices, and optical devices. In other embodiments, the storage element 201 may store analog values that vary between a high value and low value, and are not necessarily confined to a conventional one or zero value. In other embodiments, the storage element 201 may be able to store a plurality of data bits. That is, the storage element 201 may include several individual elements each capable of storing a bit. For instance, the storage element may be able to store digital words. In other embodiments, the storage element 201 may be an optical storage device.

According to one embodiment, each addressable switch element is responsive to only one of two possible signal types. When the addressable switch element receives the signal to which it is responsive, the addressable switch element becomes "active" or "conductive" and allows a signal to pass through its signal transmission channel (as opposed to its switching channel) in a signal pathway separate from the addressing or activation pathways. If all of the addressable switch elements of the virtual column have received, and continue to receive, the signal that activates them, the virtual column 200 becomes conductive. When the virtual column 200 becomes conductive, signals may pass through it. In data storage embodiments, when the virtual column 200 is conductive, the information contained in the data storage element 201 may be accessed. A read out layer 210 may be used, as discussed below, to read information out of the storage element 201 as well as to play a part in storing information in the storage element 201.

In some embodiments, the information may be accessed by coupling the read out layer 210 to the data storage element 201. For instance, if the data storage element 201 is a capacitive element (i.e., a capacitor) the read out layer 210 is electrically coupled to the data storage element 201 through the addressable switch elements 202, 204 and the feed-through 208 (i.e., through the virtual column). In this example, the addressable switch elements 202 and 204 may be electrical switches such as transistors which allow a current to pass there-through when receiving the required input signal and the feed-through 208 may be any conductor implemented as an electrical connection between the transistors (e.g., a wire). In other embodiments, the addressable switch elements 202 and 204 may be optical switches that allow energy (e.g., light or electrical energy) to pass through them when activated, and the feed-throughs may be optical fibers.

The combination of storage element 201, addressable switch elements 202 and 204, and feed-throughs may take on may forms. For instance, the virtual column 200 may include an optical storage element, and optical feed-throughs with electrically controlled addressable switch elements that change in polarization in order to allow the optical information to flow them. Theoretically, the storage elements, addressable switch elements, and feed-throughs may each be electrical elements or optical elements. Thus, there exists a minimum of nine (9) different possible configurations of virtual columns that include a data storage element, each of which is different based on the types of components from which it is constructed. These nine different possibilities are shown in Table 1 where an "E" represents an electrical element and an "O" represents an optical element.

TABLE 1

| Storage Element | Addressable Elements | Feed-Throughs |
| --- | --- | --- |
| E | E | E |
| O | E | E |
| E | O | E |
| E | E | O |
| E | O | O |
| O | O | O |
| O | O | E |
| O | E | E |
| O | E | O |

The read out layer 210 may be able to transmit the type of information contained in the storage element 201. For instance, if the storage element 201 stores optical data, the read out layer 210 should be able to carry an optical signal and conversely, if the storage element 201 stores information electrically, the read out layer 210 should be able to carry an electrical signal. Of course, a transduction element could be interspersed between the storage element 201 and the read out layer 210. In this embodiment, the read out layer should be able to carry the signal type produced by the transducer.

Of course, other type of data storage elements may also be utilized creating even further variations. For instance, the data storage element 201 could be a magnetic device.

In addition, if the storage element 201 is capable of storing more that one bit, for instance a word or a byte, the virtual column may be connected to multiple read out or write layers to simultaneously read or write multiple data elements from the storage element 201. This variation is applicable to all embodiments disclosed herein.

Addressing of Virtual Columns

Figure 3:
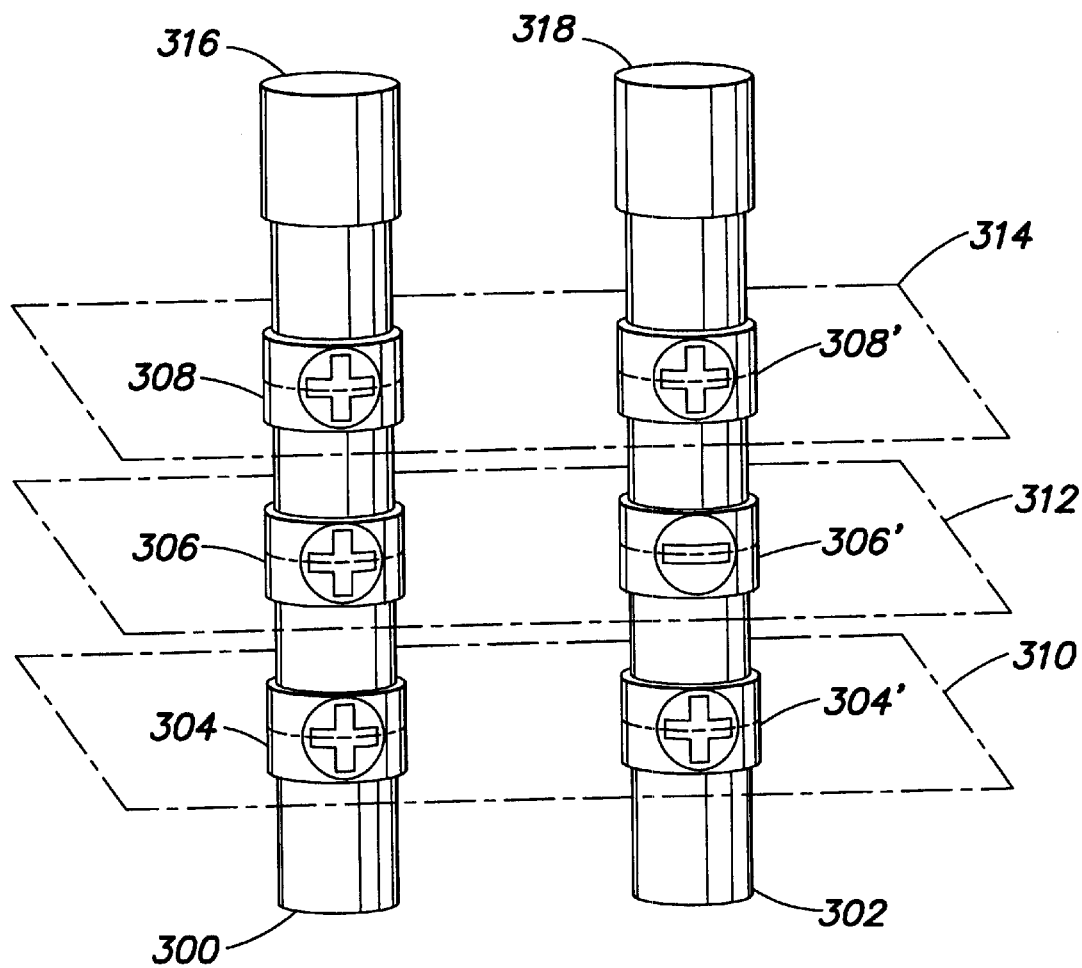
FIG. 3 is a diagram of two virtual columns connected to a plurality of addressing layers.

FIG. 3 shows a first virtual column 300 and a second virtual column 302. The first and second virtual columns, 300 and 302, respectively, will be used to explain how virtual columns may be uniquely addressed by using addressable switch elements.

The first virtual column 300, includes addressable switch elements 304, 306, and 308. The second virtual column 302 includes addressable switch elements 304', 306', and 308'. In one embodiment (discussed below), addressable switch elements 304 and 304' may be coupled so that they may both receive a signal from a first addressing layer 310; addressable switch elements 306 and 306' may be coupled so that they may both receive a signal from a second addressing layer 312; and addressing elements 308 and 308' may be coupled so that they may both receive a signal from a third addressing layer 314. However, it should be understood that the use of addressing layers in this example is by way of example only and does not, therefore, require that all embodiments of the present invention include addressing layers. This example is merely to explain the concept of how the addressable switch elements may uniquely identify each virtual column.

In the example of FIG. 3, the addressable switch elements 304, 306, 308, 304' and 308' are all activated (i.e., enabled) by a first signal value (represented as a "+" sign) and addressable element 306' is enabled by a second signal value (represented as a "−" sign). In this example, the first and second signal values are different from one another. Each addressable element in this example is only enabled when it receives the appropriate input signal value.

Thus, if the first signal "value" or "type" is presented on all three addressing layers, 310, 312, and 314, then all of the addressable switch elements of the first virtual column 300 are enabled and the first data storage element 316 of the first virtual column 300 may be accessed. However, the second virtual column 302 is not enabled because, in this example, the addressable switch element 306' is enabled only when it receives the second signal value. If the signal on the second addressing layer 312 is changed so the second signal value is present thereon, then, the second data storage element 318 of the second virtual column 302 may be accessed. In this manner, the number of unique addresses of the data storage device is bounded only by the number of addressable elements associated with the virtual columns (assuming that all virtual columns are associated with the same number of addressable elements). For example, if each virtual column is associated with three addressable elements, then there are $2^3=8$ addresses that may be used for eight different virtual columns using only three addressing layers and thus, 3 address "bits" or signals.

Example Data Storage Device and General Operation

Figure 4:
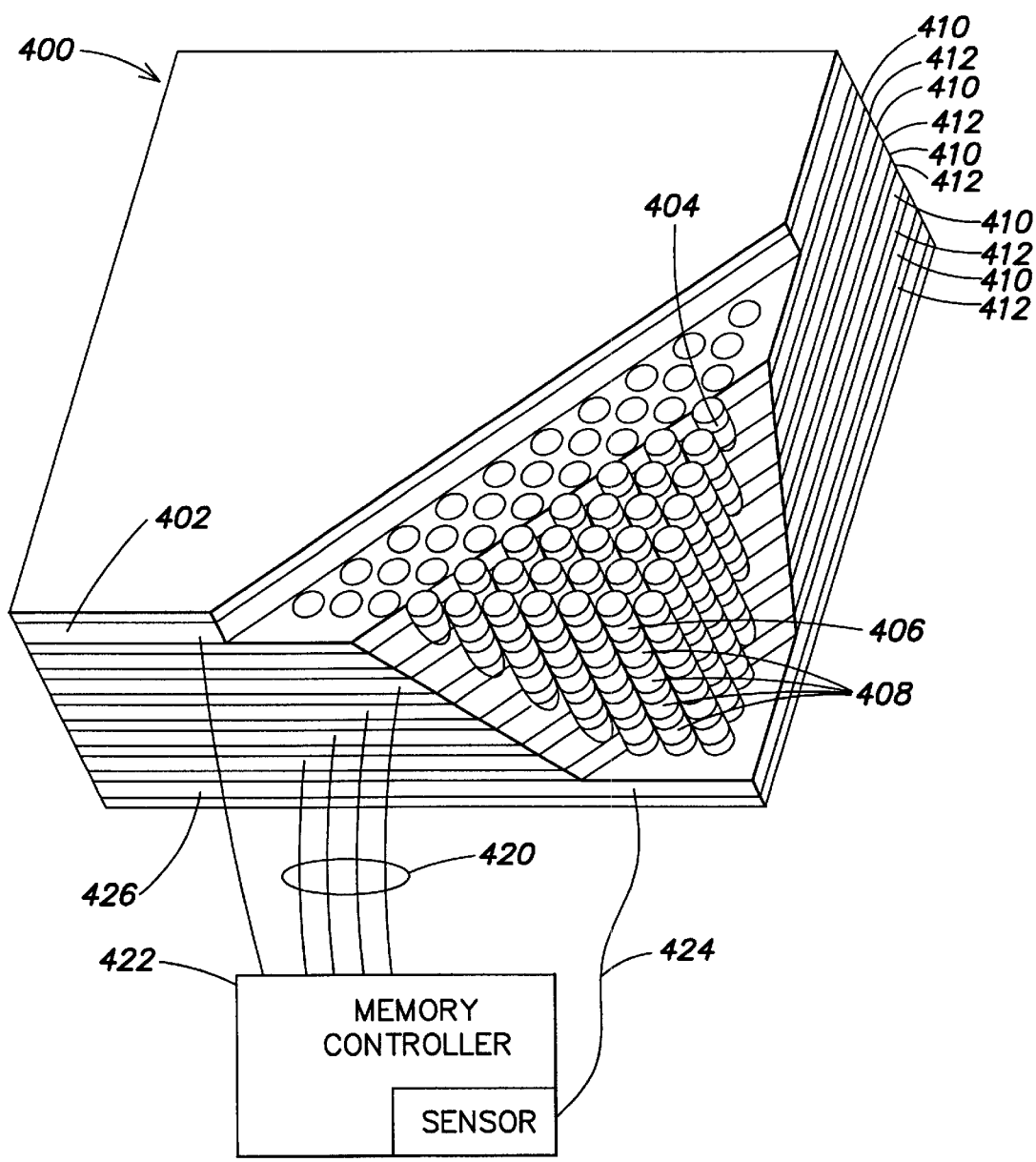
FIG. 4 is an example of one embodiment of a data storage device according to the present invention.

FIG. 4 shows a cutaway view of an example of a data storage device 400 according to one embodiment of the present invention. The data storage device 400 may be used to store data for use, for instance, in a computer. The data storage device 400 may include an activation layer 402 which enables the operation of the data storage device 400. For instance, the activation layer 402 may be a write layer that carries a binary representation of a data bit that is to be written to a storage element location of the data storage device 400.

In this embodiment, the data storage device 400 also includes a plurality of virtual columns 404. The virtual columns 404 in this embodiment are shown as discreet columns that are separate from one another. However, this is by way of example only; the virtual columns need not be discreet elements.

Each virtual column 404 may store at least one data bit in a data storage element 406 contained therein. Of course, as discussed above, the data storage element 406 may also store blocks of data. In the case where the data storage element 406 stores a single value, the data storage element 406 may be any type of device capable of storing a single data signal or bit. In some embodiments, the data bit may be represented as a logical "0" or "1." In other embodiments, a data bit may be an analog value that varies between a base value and an upper limit.

Each virtual column 404 is associated with at least one, and in some embodiments several, addressable switch element(s) 408. As discussed above, these addressable switch elements 408 are used to uniquely identify each virtual column 404. The addressable switch elements 408 determine the address for the virtual column 404 and, therefore, determine the address for the data stored in the data storage element 406 of a particular virtual column 404.

In this embodiment, the addressable switch elements 408 are coupled to addressing layers 410 capable of transmitting signals to the addressable switch elements 408. Each address layer 410 may be connected to an address line 420 that is driven by a memory controller 422 which communicates the desired address to the memory device 400. The memory controller 422 could be any type of memory driving device such as a memory management unit (MMU) commonly available from companies such as Intel and Motorola. The memory controller 422 may not need to be a separate device and may actually be part of a CPU. The memory controller 422 provides an address of the desired information (i.e., the address of the virtual column) to the address lines 420. In addition, the memory controller 422 should be capable of providing data to and receiving information from the memory device 400. To this end, the memory controller 422 may include an information line 424 which facilitates the reading and writing of information to and from the memory device 400. The information line 424 may be coupled to the read out layer 426.

In other embodiments, the memory controller 422 may be omitted and control of the memory device 400 is provided by the CPU directly.

In this example, the addressing layers 410 are separated from adjacent addressing layers by insulating layers 412. These insulating layers 412 serve to keep any signal present on one addressing layer from interfering with a signal on another addressing layer. Of course, the insulating layers are not necessary if the signals being received do not interfere with one another. For example, if the signals are light signals, the insulating layers may not be needed.

Each addressing layer 410 may be adjacent to and conduct a signal to one of the addressable switch elements 408 of each of the virtual columns 404 disposed in the data storage device 400. Each addressing layer 410 may be formed from any material which may carry a signal. For instance, the addressing layers 410 may be formed from an electrical conductor such as gold, silver, copper, aluminum foil, aluminum film material, and the like if the addressable switch elements 408 respond to electrical input signals. Alternatively, the addressing layers 410 may be formed from a photo-conductor which transmits light such as glass or a polymer if the addressable switch elements 408 respond to optical input signals. In one embodiment, each addressable switch element 408 of the virtual columns 404 may be surrounded by a conductive material and if a plurality of virtual columns 404 are brought into contact with one another, conductive material portions surrounding the addressable switch elements 408 may contact one another and thereby form a conductive addressing layer.

In general, the data storage device 400 of this embodiment works as follows. An external device, such as a central processing unit (CPU) of a computer or the memory controller 422, alerts the data storage device 400 that the device needs to access or store information in or to the data storage device 400. This may be accomplished in a variety of ways. For instance, the data storage device 400 may have an enable line (not shown) connected to the external device which enables the data storage device 400 upon receipt of a signal on the enable line. Alternatively, the data storage device 400 may be directly connected to the external device in a "master-slave" arrangement and, in that case, no enabling signal is required.

Regardless, after the data storage device 400 is ready to conduct either reading or writing signals (i.e., it is enabled), an address is transferred to the addressing layers 410. The signal on each addressing layer is transferred to an addressable switch element 408 of each of the virtual columns 404. As discussed above, each addressable switch element 408 may be responsive to one of two input signal values. If the signals on each of the addressing layers 410 collectively match the responsive pattern of the series of addressable switch elements 408 in a particular virtual column 400, the virtual column 400 becomes "conductive" and the storage element 406 may be accessed for reading or writing. For instance, when all of the addressing elements 408 are receiving a signal which activates them and allows them to pass electrical current, the value stored in the data storage element 406 may be electrically coupled to a read out layer 426. If current is discharged, the value stored in the storage element 406 is a one. If no current is discharged, the value is a zero. Of course, all addressing elements 408 may, in some embodiments, need to receive the addressing signal for the entire time it takes until the current (or other signal) is sensed. However, in some embodiments this may be advantageous over the prior art in any event because there is not the need to first address a column and then a row; only one "addressing cycle" may be required.

It should be understood that depending upon the type of data storage element used, such elements may need to be periodically refreshed. For instance, if the data storage element is a capacitive element, it is well known such elements need to be periodically refreshed to preserve the integrity of the data value stored therein. In addition, if, when the storage element is read a discharge occurs, the storage element will need to be "reset" by writing a logical one thereto. This may be accomplished by enabling the column(s) that were recently read and applying a bias or voltage between the data storage element 406 and the read out layer 426 that serves to charge the data storage element. Of course, some data storage elements do not discharge and thus, do not need to be reset after being read. Examples of such elements may include magnetic devices, electrochemical devices such as a battery, liquid crystal devices and stereochemical devices.

Writing to a data storage element may be accomplished in much the same manner as described above except that after the column is enabled a value is presented to a read/write (not shown) layer instead of read out from the read out layer 426. In this manner the writing may be very similar to refreshing if the data storage element is capacitive or is a transistor "flip-flop" or the like.

In some applications, it may be desired to access several storage elements 406 sequentially. In those instances, the memory device 400 may include a device that sequentially accesses different addresses based on a starting address. Examples of such devices may include a binary counter or a memory map designed to transmit a sequence of addresses based on an initial address. In the case when a binary counter is used, the binary counter receives a starting address and its outputs may be coupled to the addressing layers. The counter then "counts up" until an end address is reached.

The embodiment shown is substantially rectangular in shape. One of ordinary skill will readily realize that the present invention is not limited to the particular shape. In fact, memory devices as well as non-memory matrices of the present invention may be of any cross-sectional shape because the virtual columns may be disposed in any arrangement so long as their respective addressable switch elements may be coupled to the appropriate input addressing signals by means of appropriate addressing layers.

Examples of Addressing Layers

Figure 5:
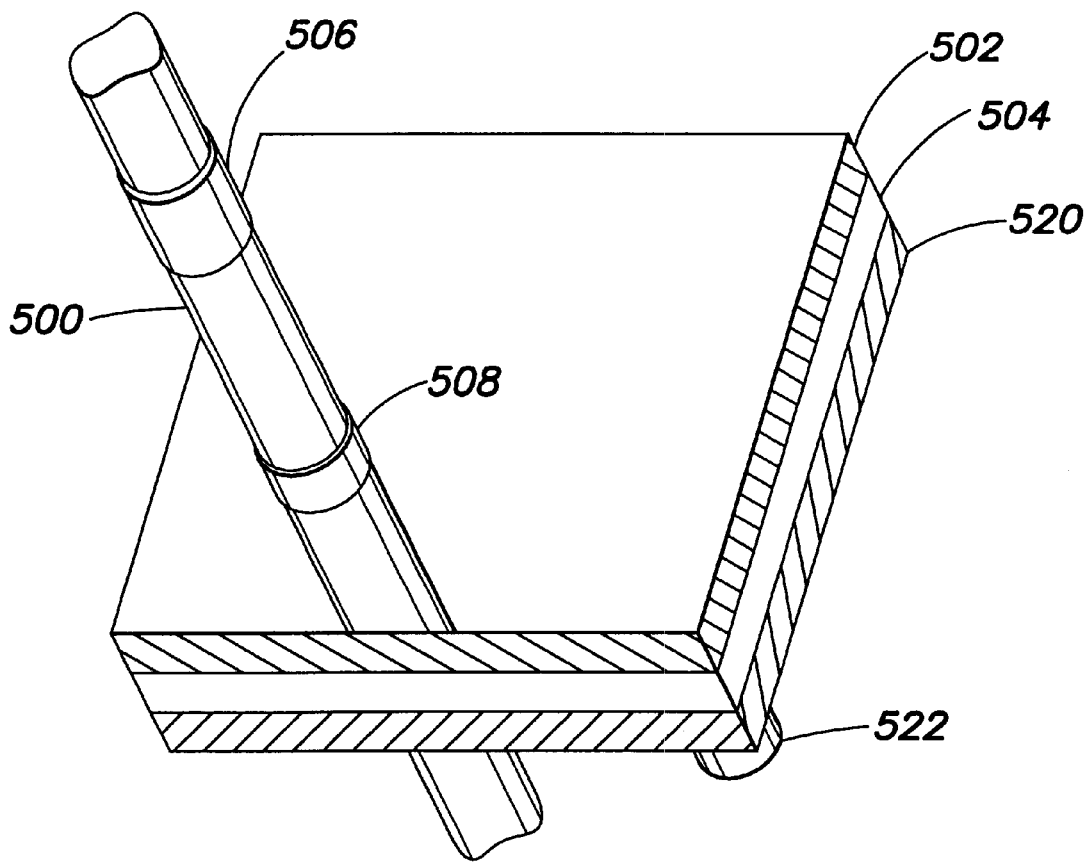
FIG. 5 is a cut-away view of a virtual column disposed through an addressing layer and an insulating layer.

FIG. 5 shows a virtual column 500 disposed through an addressing layer 502 and an insulating layer 504. The insulating layer 504 may be any type of layer which is capable of keeping a signal on one addressing layer from interfering with or contacting a signal on any other layer. For example, the insulating layer 504 may be composed of an adherent insulating tape or a non-conductive polymer. Alternatively, the insulating layer could be co-formed with the addressing layer 502 and fused thereto. For example, the insulating layer could be an electrically insulating polymer sprayed on at least one side of a thin addressing layer. In yet another alternative, the addressing layer could be an electrically conductive film sprayed on to at least one side of a non-conductive polymer.

The virtual column 500 may include a data storage element 506 and an addressable switch element 508. Of course, if the device does not store data, the data storage element 506 may be omitted. The addressable switch element 508 is displaced such that it is in a conductive relationship with the addressing layer. A conductive relationship as used herein shall refer to a relationship between the addressable switch element 508 and the address layer 502 such that a signal presented on the addressing layer 502 may be received by the addressable switch element 508. For example, if the addressable switch element 508 is an n-type bi-polar transistor the gate of the transistor may be electrically coupled to the address layer 502, which in this example would be an electrically conductive medium such as aluminum or gold foil. If, for example, the addressing layer 502 conducts photonic signals such as light (e.g., a glass addressing layer) the addressing element 508 may be an optical switching device that has an optical gate connected to the glass layer.

As discussed above, when all of the addressable switch elements in a particular virtual column receive the correct one of two possible signal values, all of the addressable switch elements are in an "enabled" or "active" state. When all of the switches are in the enabled state, the virtual column 500 as a whole become conductive. When the virtual column 500 becomes conductive, the storage element 506 may be accessed for data storage or retrieval. If the virtual column 500 does not include a data storage element, when the virtual column 500 is conductive a desired signal may pass therethrough.

The embodiment of FIG. 5 may also include a read out layer 520 and a read out contact 522. When the virtual column 500 becomes conductive, the read out layer 520 is coupled to the data storage element 506. For instance, if the storage element 506 is an electrical element and contains a logical 1, the voltage falls across the data storage element 506 and, due to the intrinsic conductance of the addressable switch elements 508 and the data storage element 506, leads to a current being discharged through the read out layer 520 to the read out contact 522. The read out contact 522 may be connected to a device such as a sense-amp that can determine that a current is being discharged and recognize this as the effect of a logical 1.

In this manner, the inherent delay of reading and writing over narrow extended pathways is reduced. The furthest distance to be traversed is from one side of a memory device of the present invention to the other and may be less depending upon the configuration of the device. For instance, if the device is circular with a hole in the middle (like a doughnut), the sense-amp could be displaced in the center and the farthest distance traveled would be the radius of the circular device.

Addressable Switch Elements

Example types of addressable switch elements are switches that are responsive to electrical signals such as transistors. For this type of switch, each switch may be thought of as responsive to, for instance, one of two voltages. The first type of switch may allow conduction when it receives a voltage in excess of a threshold voltage at it's gate. An example of such a switch would be a PNP transistor. The second type of switch may become active when it receives a null or a negative voltage at its gate. An example of such a switch would be an NPN transistor.

Alternative types of switches that may be used as addressable switch elements are optical switches that are activated by a particular wavelength. The first type would open (i.e., become conductive) when receiving one specific wavelength or polarization state, and the second type would open when receiving a second wavelength or polarization state. Such an optical switch could be created by doping a portion of a virtual column made of fiber optic cable so that it allows for the conduction of data when exposed to a particular wavelength or polarization.

Figure 6A:
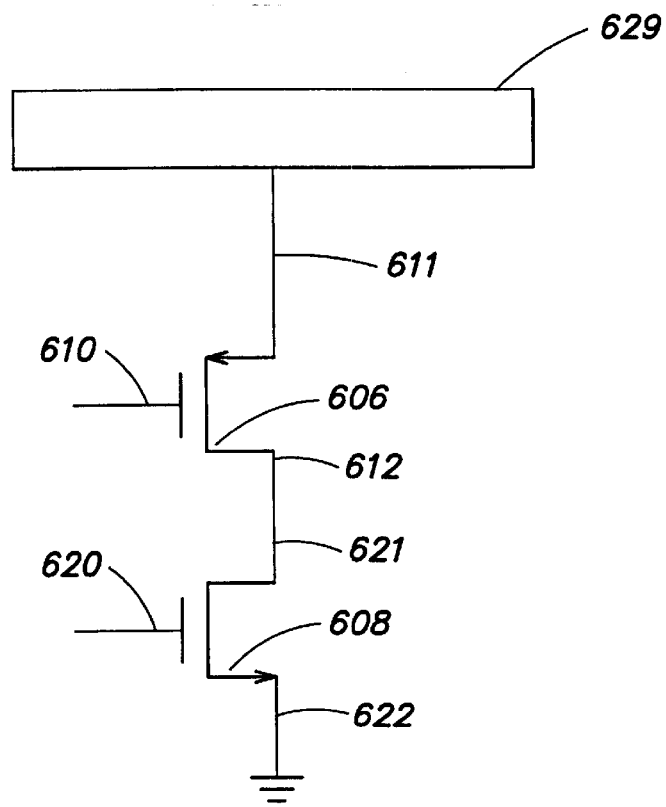
FIG. 6a is an example of two addressable switch elements connected in series to form a portion of a virtual column.

In some embodiments each addressable switch element of the virtual column may be displaced from the other elements some distance. However, as one of ordinary skill will realize, the addressable switch elements could be physically connected to one another. For example, and referring now to FIG. 6a, a first addressable switch element 606 is physically connected to a second addressable switch element 608. In FIG. 6a, by way of example only, the first and second addressable switch elements 606 and 608 are represented as transistors. The first transistor 606 is a p-type MOSFET having a gate 610, a source 611, and a drain 612. The second transistor 608 is an n-type MOSFET having a gate 620, a source 621, and a drain 622. The drain 612 of the first transistor 606 is electrically coupled to the source 621 of the second transistor 608. As is well known in the art, an electrical signal (i.e., a current) may pass from the source 611 of the first transistor 606 to the drain 612 of the first transistor 606 when an appropriate voltage is supplied to the gate 610 of the first transistor 606. The gate 610, in this example, is the portion of the first addressable switch element 606 (or transistor as shown) which contacts and receives an addressing signal from an addressing layer (not shown).

If the gate 620 of the second transistor 608 is receiving the appropriate signal, the second transistor 608 will also become conductive and allow the current to pass from its source 621 to its drain 622. In this manner, when all of the addressing elements are conductive, the information contained in the data storage element 629 (if present) may be read out or written to through the now conductive column. It should be understood from the teachings herein that not every embodiment has data transmitted through the column. Rather, in some embodiments, the column may be used only as a means to activate the data storage element 629 so that other means may then read from or write to it. In devices that do not store data, other effectors, sensors or interconnecting switches may be enabled.

Figure 6B:
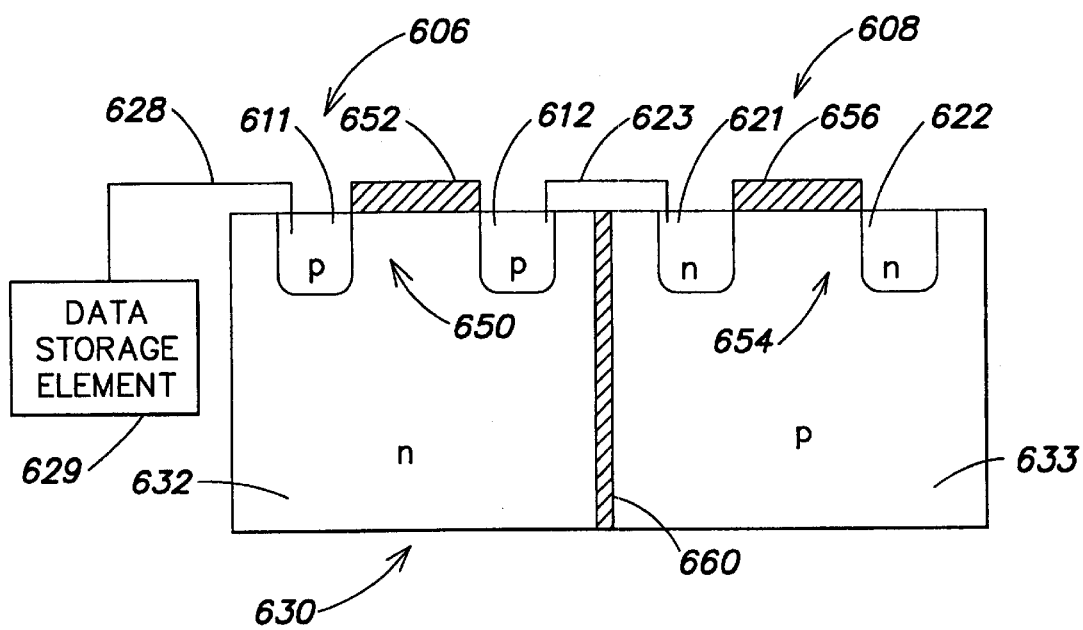

FIG. 6b shows a more detailed version of the first transistor 606 and the second transistor 608. In this embodiment, the first transistor 606 and the second transistor 608 are connected in series to form a portion of a continuous virtual column 630. The first transistor 606 includes an n-type substrate 632. The source 611 and drain 612 of the first transistor 606 may each be formed of p-type regions displaced in the n-type substrate 632 and separated by a first conduction channel 650 formed of the n-type substrate 632.

The first conduction channel 650 is preferably connected to a first gate contact 652 which is electrically coupled to a first addressing layer (not shown). The source 611 is electrically coupled to, in this example, a data storage element 629 by feed-through 628.

The drain 612 of the first transistor 606 may then be electrically connected to the source 621 of the second transistor 608 by feed-through 623. The source 621 and the drain 622 of the second transistor 608 may be formed of n-type regions and are separated by a second conduction channel 654 in a p-type substrate 633. The second conduction channel 654 is electrically coupled, through a second gate contact 656, to a second addressing layer (not shown) which is different from the first addressing layer. In this manner, the virtual column 630 operates like the transistor schematic shown in FIG. 6a. In addition, and as one of ordinary skill in the art will readily realize, the virtual column 630 may also include a separating layer 660 which electrically separates the first and second transistors, 606 and 608, respectively. A similar separating layer may be disposed between each transistor contained in the virtual column 630.

Methods of Construction and Alternative Embodiments

The preceding discussion has dealt in general terms of operation using one example embodiment. This example may be thought of as a "stacked conductor sheet" type of device because it includes stacked addressing layers. One issue with such a device is making sure that the addressable switch elements of the virtual columns are coupled to the addressing layers so that the addressable switch elements receive input address signals. There are several ways in which the device may be created that address this and other issues.

In one embodiment, the addressing layers may be stacked and then the virtual columns inserted. If this approach is taken, holes for insertion of virtual columns may need to be created (or kept open if they already exist in the addressing layers) so that the virtual column may be inserted or deposited in situ. The contacts of the addressable switch elements may be prefabricated such that when inserted into the addressing layers they may couple to the addressing layers.

Figure 7A:
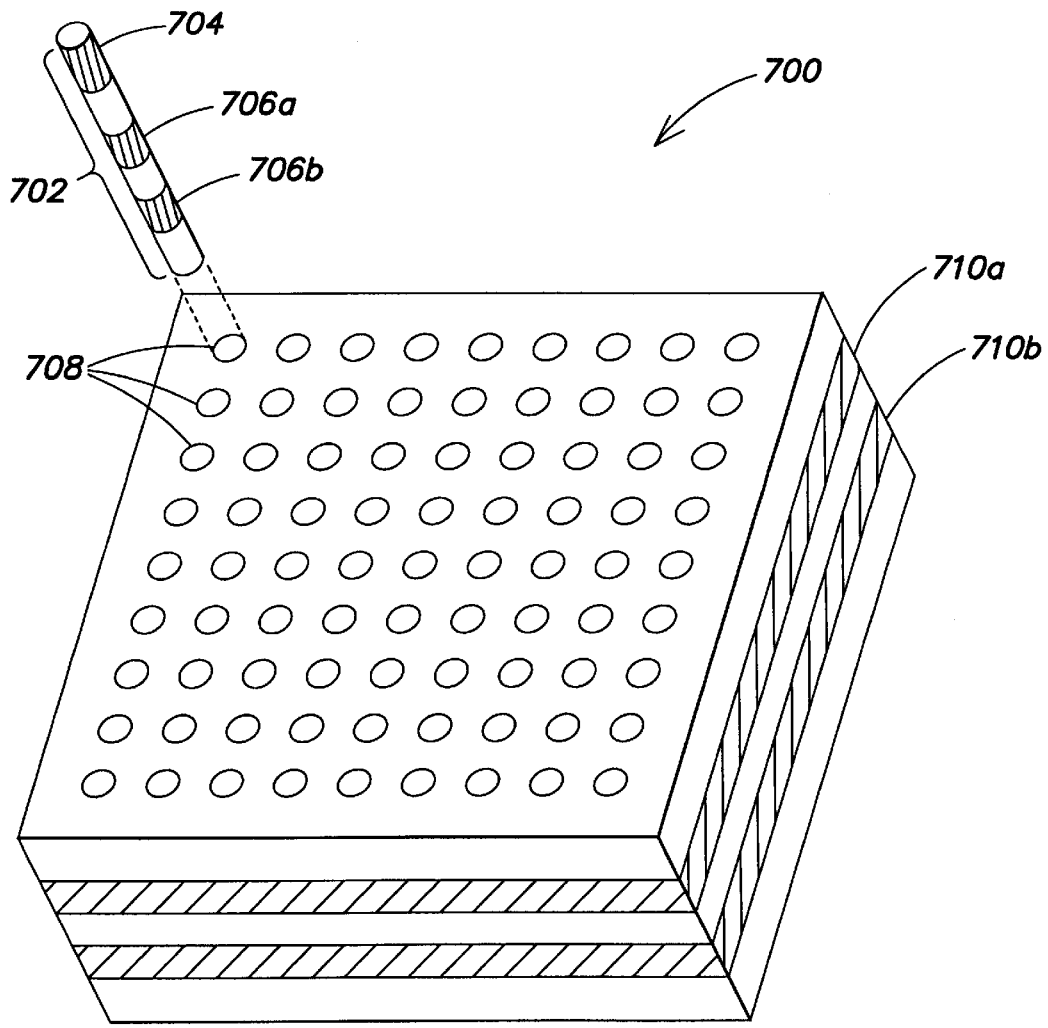
FIG. 7a is an example of one embodiment of a memory device before a virtual column is inserted therein.
Figure 7B:
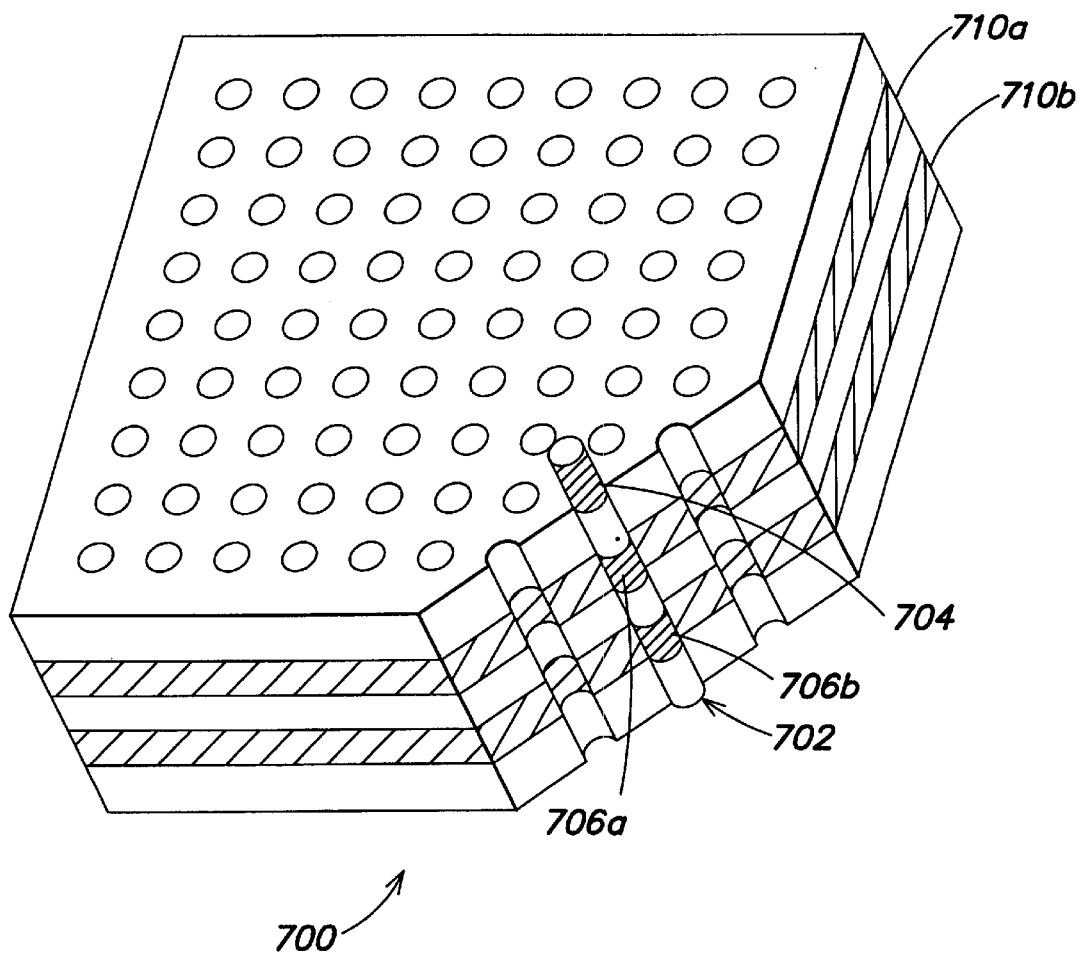
FIG. 7b is a cut-away view of a memory device having a virtual column inserted therein.

FIGS. 7a and 7b show, respectively, a memory device 700 before and after prefabricated virtual columns have been inserted. In the embodiment described in relation to FIGS. 7a and 7b, the virtual column 702 includes a data storage element 704 and two addressable switch elements 706a and 706b. The virtual column 702 may be similar in appearance to a "pin" to be inserted into the memory device 700. It is contemplated that the virtual column 702 may be rigid or flexible depending upon how they are fabricated. For instance, if the column is made similar to those shown above in FIGS. 6a and 6b, the virtual column 702 may be rigid due to the substrate material from which they are composed. However, the virtual column 702 may be flexible if made from a fiber-optic strand or the like.

The memory device 700 in FIG. 7a includes a plurality of holes 708 into which the virtual column 702 may be inserted. It is contemplated that an automated machine may insert the virtual columns 702 into holes 708. In this manner, the machine may be programmed such that when the columns are inserted the addressable switch elements 706a and 706b line up with and are electrically or otherwise coupled to the addressing layers 710a and 710b, respectively.

FIG. 7b shows a memory device 700 after a virtual column 702 has been inserted into one of the holes 708 shown in FIG. 7a. The addressable switch elements 706a and 706b are arranged with respect to the addressing layers 710a and 710b, respectively, such that a signal presented to the addressing layers may be coupled or otherwise communicated to the addressable switch elements.

In this embodiment, a read-out layer is not included. Thus, the data storage element 704 is not coupled to any layer and is shown extending above the top of the memory device 700. This illustrates a variability aspect of the present invention, namely, that the data storage element need not be the same type of element as the addressable switch elements. For instance, the data storage element 704 could be an optical storage element while the addressable switch elements 706a and 706*b* may be transistors or other electrical switches. In that case, a read/write layer (not shown) could be added (or originally included) that is capable of conveying an optical representation of data to be stored to the data storage element 704. Of course, additional implements capable of reading such an optical element may need to be included as one of ordinary skill will readily realize.

Similarly, the addressable switch elements 706*a* and 706*b* could be optical switches and the data storage element 704 could be an electrical storage device such as a capacitor or transistor latch. One of ordinary skill, based on the teachings herein, would only need to decide which type of data storage and addressable elements are most appropriate for a specific application and could cause the correct type of addressing layers and read/write layers from which to construct the memory device 700.

Figure 8:
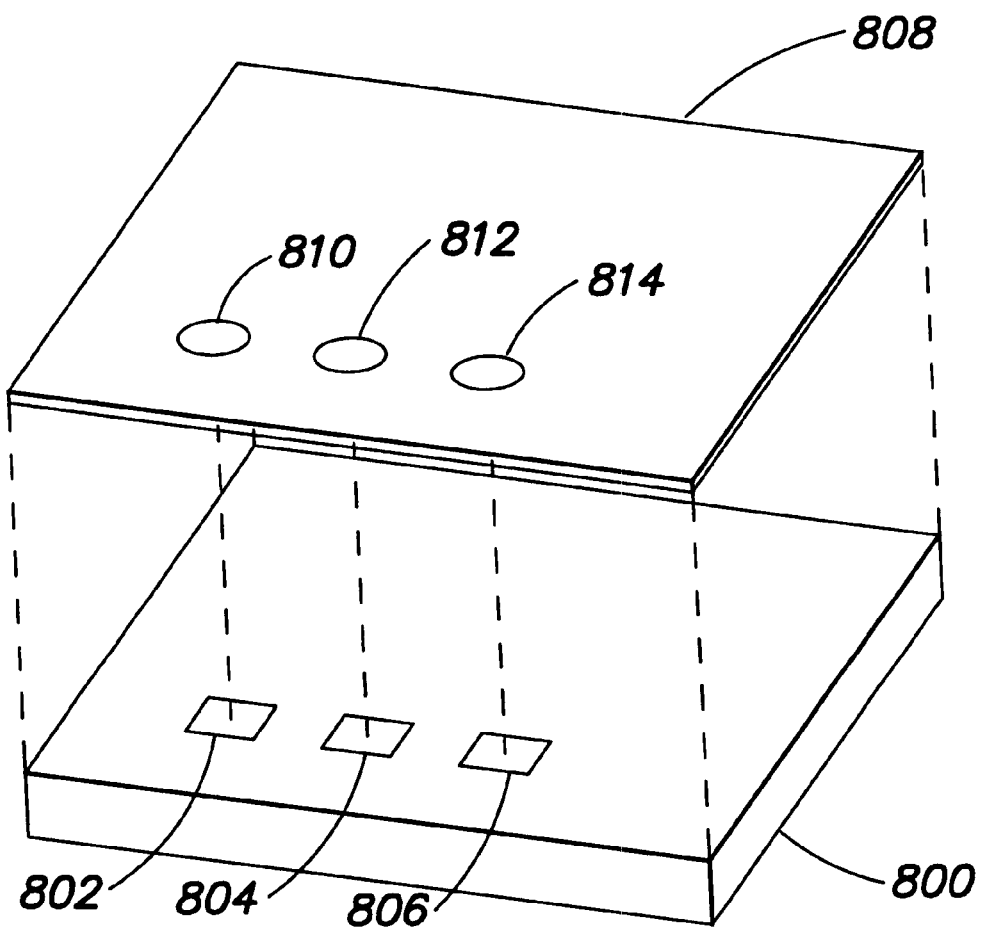
FIG. 8 is an exploded view of two addressing layers showing an example of how addressing layers of some embodiments of the present invention may be constructed.

In another embodiment, the addressable switch elements may be printed on each layer as it is constructed. For instance, and referring now to FIG. 8, a first addressing layer 800 may have addressable switch elements 802, 804 and 806 placed thereon. The addressing elements may be placed on the first addressing layer by standard means such as photolithography, machine placement, or the like. As before, these addressable switch elements 802, 804 and 806 may be responsive to one of two signal values so that when the correct signal is received, the addressable switch elements 802, 804 and 806 are enabled. The addressable switch elements 802, 804 and 806 may be coupled to the first addressing layer 800 in order to receive an addressing signal.

The second addressing layer 808, having holes 810, 812 and 814 which pass through the second addressing layer 808, may be placed on top of the first addressing layer 800. In one embodiment, the holes 810, 812 and 814 may overlie the addressable switch elements 802, 804 and 806, respectively. The holes 810, 812 and 814 may then be filled with a material (i.e., a feed-through) that couples the addressable switch elements 802, 804 and 806 to the top of the second addressing layer 808. Next, additional addressable switch elements may be placed or printed on the second addressing layer 808. This process may be repeated until the desired number of addressing layers is present in the memory device.

Of course, the process need not be carried out exactly as described above. For instance, the first and second addressing layers, 800 and 808, respectively, could be prefabricated and any holes there-through already filled with feed-throughs of the appropriate type. In addition, in some embodiments, all of the addressable switch elements may be located (i.e., printed or placed) on the addressing layers before they are stacked on one another. One of ordinary skill will realize that the addressable switch elements may be one of at least two types and placed so that when the addressing layers are stacked, a plurality of virtual columns each having a unique address is created.

Figure 9A:
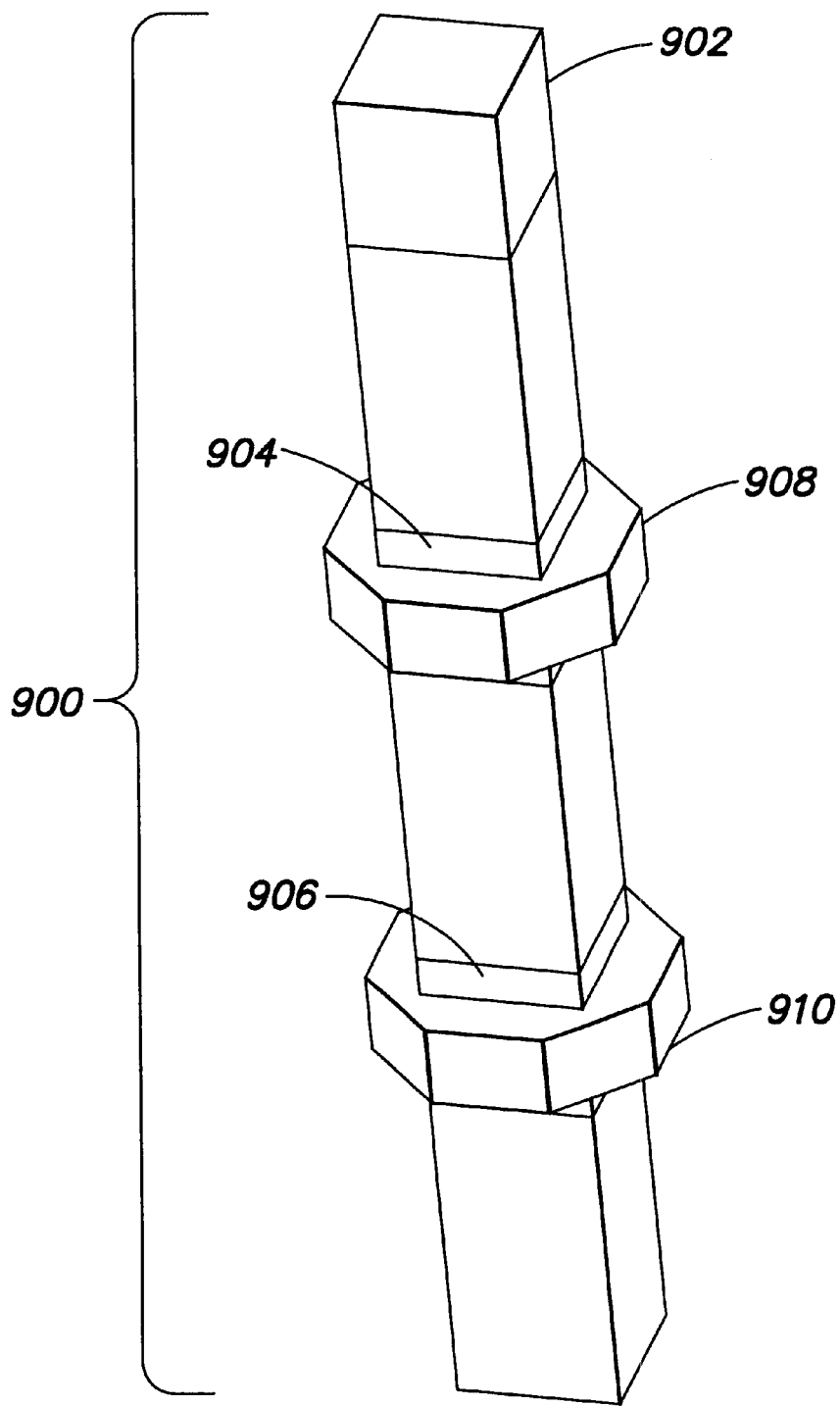
FIG. 9a discloses another embodiment of a virtual column according to the present invention.

FIG. 9*a* shows another embodiment of a virtual column 900. In this embodiment, the virtual column 900 may include a data storage element 902, a first addressable switch element 904 and a second addressable switch element 906. Of course, as before, the data storage element 902 is not required in all applications and may be omitted in those applications. The first addressable switch element 904 and the second addressable switch element 906 are surrounded by conducting elements 908 and 910, respectively. The conductive elements 908 and 910 are coupled with the addressable switch elements which they surround (i.e., to addressable switch elements 904 and 906, respectively). That is, if an input signal is applied to the conducting elements such a signal will be transferred to the addressable switch elements which the conducting elements surround.

Figure 9B:
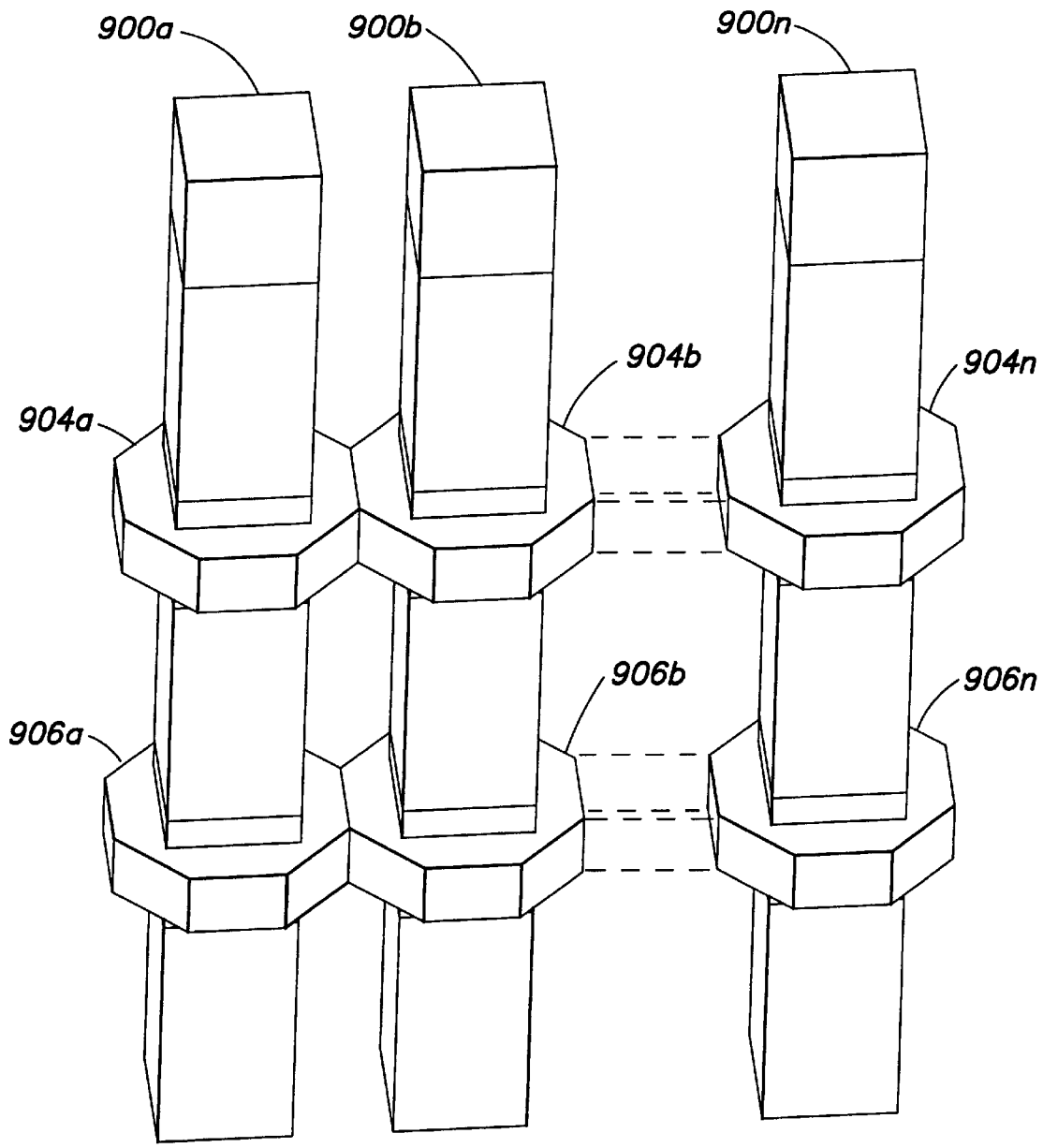
FIG. 9b shows a plurality of virtual columns constructed in a similar manner to the virtual column of FIG. 9a coupled to one another.

FIG. 9*b* shows several virtual columns 900*a*, 900*b*, . . . 900*n* constructed similar to the virtual column 900 of FIG. 9*a* which have been brought together such that conducting elements 904*a*, 904*b*, . . . 904*n* and 906*a*, 906*b*, . . . 906*n* are in contact with each other. The conducting elements 904*a*, 904*b*, . . . 904*n* collectively form an addressing layer that may carry signals to the addressable switch elements contained in each virtual column. Of course, the virtual columns may need to be connected to a read-out layer or the like in order for them to operate as a memory device as described above.

Figure 10:
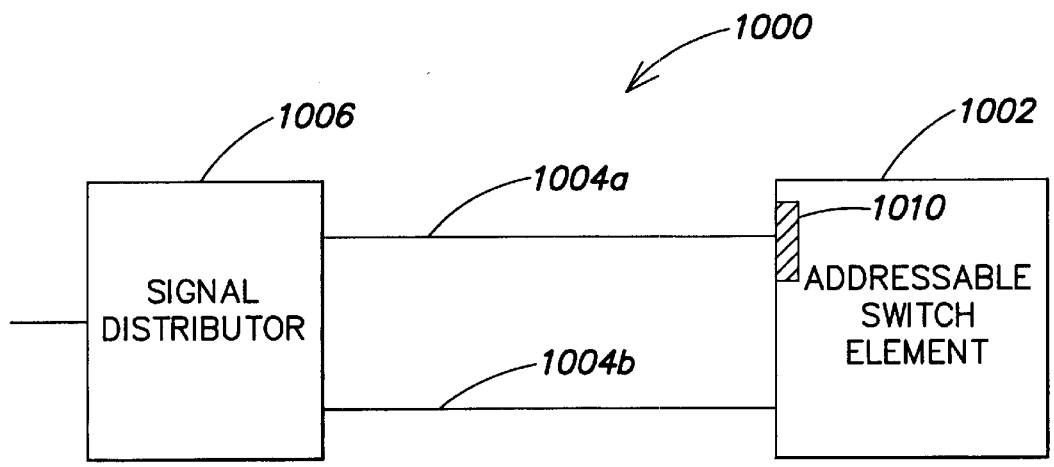
FIG. 10 shows a portion of a virtual column wherein two addressing layers are connected to a single addressable switch element.

FIG. 10 shows an example of another embodiment of the present invention. In this embodiment, the addressing techniques are slightly altered from those described above. However, the general theory is the same, that is, the matrix of virtual columns may still be constructed so that, in some embodiments, only a single line for each bit of the address is needed.

In this embodiment, the illustrated portion of a virtual column 1000 includes an addressable switch element 1002. Only one addressable switch element is shown for sake of clarity. However, it should be understood that many addressable switch elements would normally be present as described above.

Each addressable switch element is connected to two different addressing layers, e.g., addressable switch element 1002 is connected to addressing layers 1004*a* and 1004*b*. However, the portion 1010 of the addressable switch element 1002 that causes the addressable switch element to become enabled may be connected to either of the addressing layers. Both of the addressing layers associated with addressable switch element 1002 are connected to signal distributor 1006 which serves to cause only one of the two addressing layers to be energized, e.g., driven to a logical one, regardless of the input signal.

Figure 11:
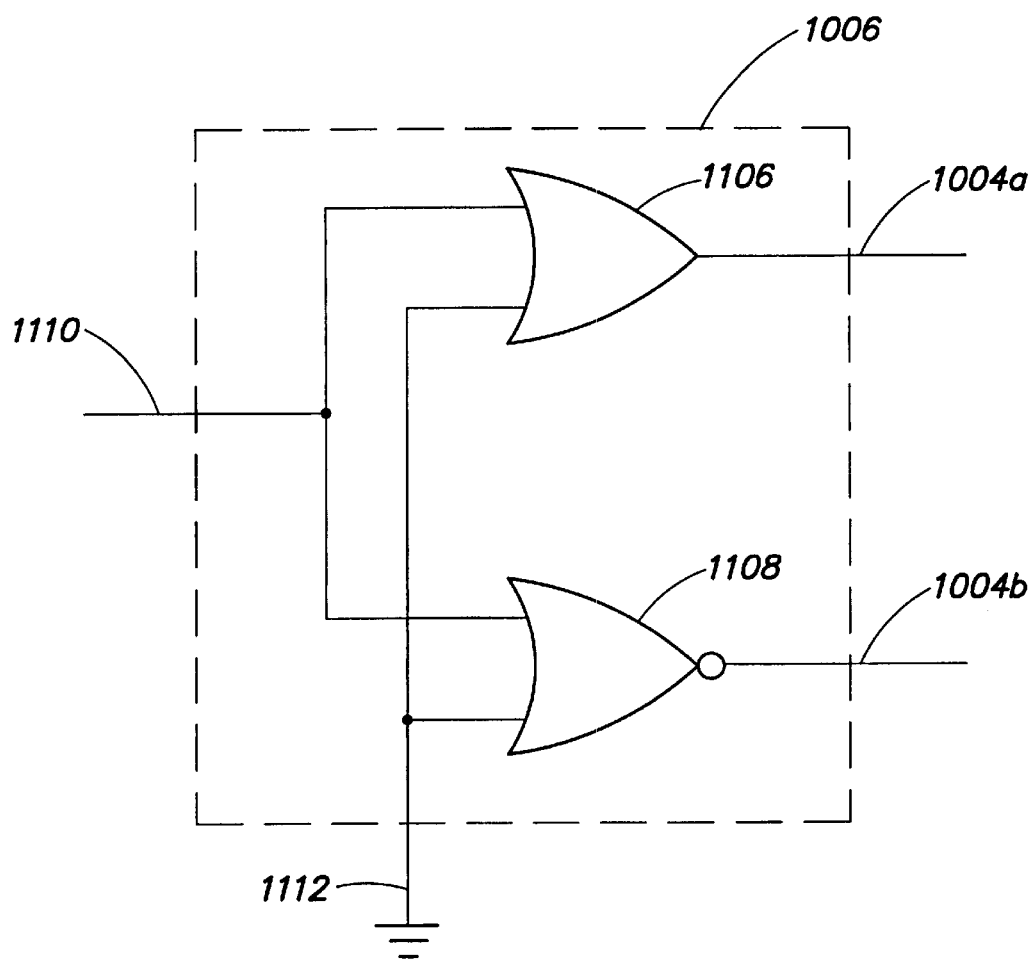
FIG. 11 is a schematic of one embodiment of the signal distributor illustrated in FIG. 10.

FIG. 11 shows an example of a signal distributor 1006. The signal distributor 1006 allows any input to place a high value on either the first addressing line 1004*a* or the second addressing line 1004*b*. The signal distributor 1006 includes, in this example, an OR gate 1106 and a NOR gate 1108. Both the OR gate 1106 and the NOR gate 1108 have one input connected to an address line 1110 and the other input connected to ground 1112. If the input address is a logical one, the first addressing line 1004*a* is energized and, conversely, if the input address is a logical zero, the second addressing line 1004*b* is energized.

Referring now back to FIG. 10, the portion of each addressable switch element 1002 which enables the addressable switch element, the enabling portion 1010 (e.g., the gate of a transistor) is connected to one of the two addressing layers 1004*a* or 1004*b* provided to the addressable switch element. For example, the enabling portion 1010 of the addressable switch element 1002 is connected to the high addressing layer 1004*a*. In this manner, only a single type of addressable element may be needed, the dual addressing nature described above being accomplished by connecting the enabling portion 1010 to one of the two different addressing layers, both of which deliver a high or low value, depending on the context, to the addressable switch element 1002. In other words, one could use only p-n-p transistors and could still have different addresses depending upon which addressing layer the enabling portion 1010 of each addressable switch element 1002 is connected to. Each additional addressable switch element of the virtual columns may be similarly constructed and connected.

Figure 12:
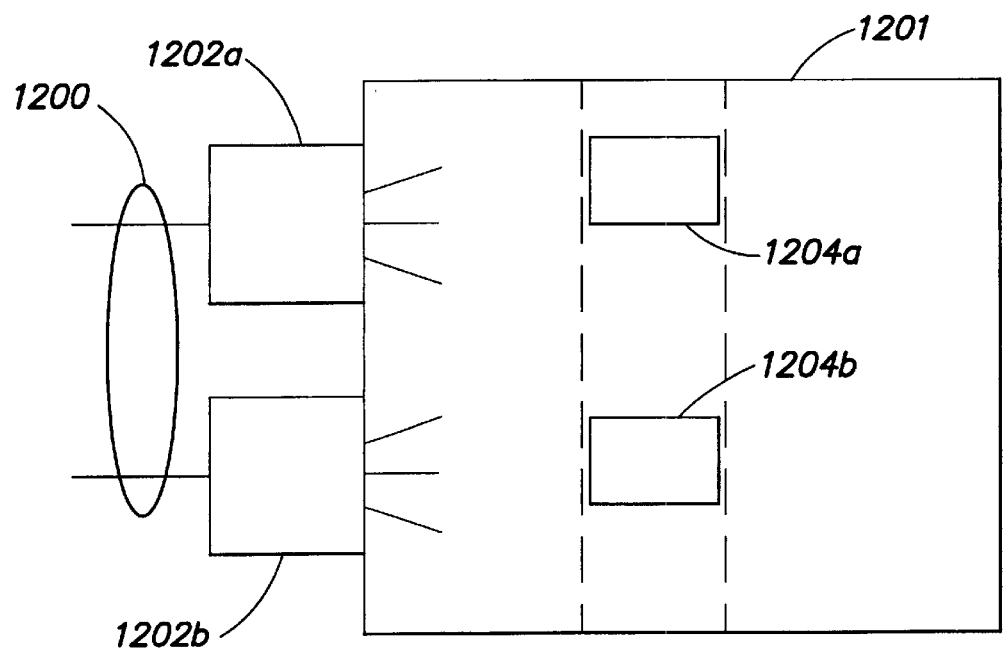
FIG. 12 shows yet another alternative embodiment of a memory device that does not include discrete addressing layers.

FIG. 12 shows another alternative embodiment of a memory device 1201 according to the present invention. This embodiment does not require the addressing layers discussed above but, rather, utilizes addressing signals that pass through the memory device 1201. In this embodiment, the address lines 1200 are connected to signal generators 1202a and 1202b which generate the desired addressing signals. Only two signal generators are shown for reasons of clarity, but several more could be included depending on the size of the memory device.

The signal generators 1202a and 1202b may be any type of device which receives one of two signals and outputs one of two signals based on the input. For instance, the signal generators may each include two LED's which output light at two different frequencies depending upon the input signal (e.g., when a logical one is received the first LED outputs light at a first frequency and when a null is received, the second LED outputs light at a second frequency). Alternatively, the signal generators could receive input signals and generate the following types of addressing signals: high frequency a.c. signals having two different frequencies, two phase-shifted high frequency a.c. signals, varying microwave signals or optical (such as laser) signals of different frequencies.

Regardless of how the signals are generated or what type of signal is generated, addressing of the embodiment of FIG. 12 is conducted as follows. First, the signal generators 1202a and 1202b receive inputs from the address lines 1200. Then, the generators produce the desired output. The addressable switch elements 1204a and 1204b are responsive to only one of two signals that a particular signal generator 1202 may generate.

In some embodiments, each signal generator 1202 generates two signals which are different from the two signals generated by every other generator. For instance, signal generator 1202a, which is associated with the first addressable switch element 1204a, may generate light waves having frequencies of 1 and 2 GHz and signal generator 1202b, which is associated with the second addressable switch element 1204b, may generate light waves having frequencies of 3 and 4 GHz. Because each signal generator 1202 may generate unique signals, and addressable switch elements associated with each signal generator are responsive only to the two signals generated by the signal generator, the need to separate the addressing layers described above (or to maintain rigid alignment and registration of the addressable switch elements) becomes moot. Thus, in this embodiment, the memory device as a whole may be made of a clear substance that allows the desired signals to pass there-through. Of course, the substance need not be clear, it only needs to be able to pass all of the signals generated by the signal generators 1202.

Of course, the depiction of two different signal generators in FIG. 12 is by way of example only. A single generator that generates the requisite signals could be used instead.

Several different possible embodiments have been disclosed above. The following explains how information may be written to or read from some of the data storage embodiments in more detail than described above.

Figure 13:
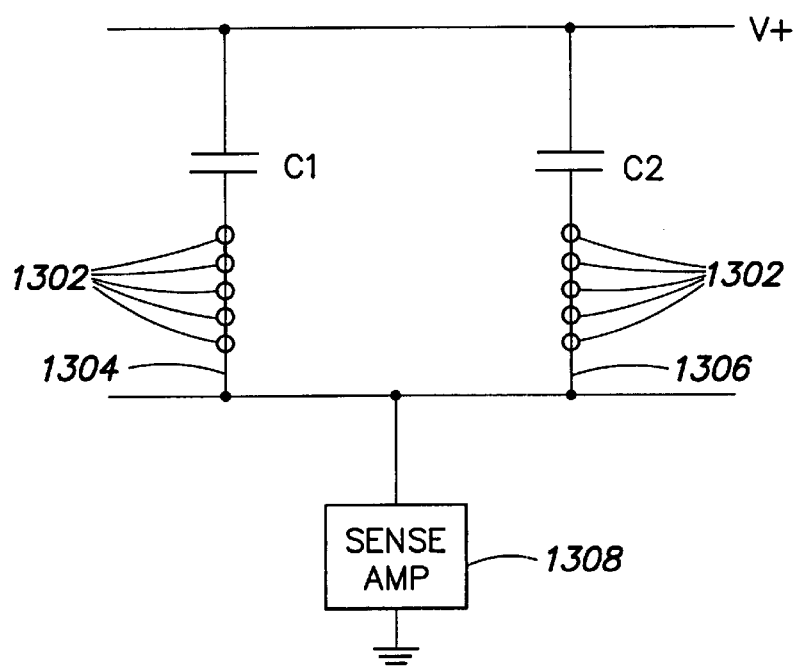
FIG. 13 is an example of one embodiment of the present invention implemented as a dynamic random access memory (DRAM) utilizing capacitors as the memory elements.

FIG. 13 shows one embodiment of the present invention implemented as a dynamic random access memory (DRAM) having capacitors C1 and C2 as the data storage elements. For simplicity in explanation, the addressable switch elements 1302 are simply shown as bubbles and may be for example, electrically or optically activated switches. Regardless of the type of elements which comprise the addressable switch elements 1302, such a DRAM works as follows.

Each capacitor (e.g., data storage elements shown as C1 and C2 in this example) is connected to a positive voltage line V+ at one end. The other end of each capacitor C1 and C2 is connected, respectively, to columns 1304 and 1306. When the column becomes enabled, the capacitor is allowed to discharge (if a charge has been stored) to ground through sense amp 1308.

For read operations, if the sense amp 1308 senses a current, that means that the value stored in the capacitor is a one. If no current (or a very small current) is detected, then the value is a zero. If the value is a one, the CPU should, at a later time, refresh the capacitor by writing a one to it. This may be accomplished by addressing the column again and keeping the column enabled (i.e., keep the same address on the address lines) until the capacitor has time to recharge.

Writing in this embodiment is very similar to reading. To write a one, the desired column simply needs to be enabled long enough to charge the capacitor. To write a zero, the column merely needs to be addressed long enough to discharge the capacitor. Of course, if the value stored in the capacitor already is a zero, this can be determined by the sense amp 1308 and the time the column needs to be enabled can be reduced.

Figure 14:
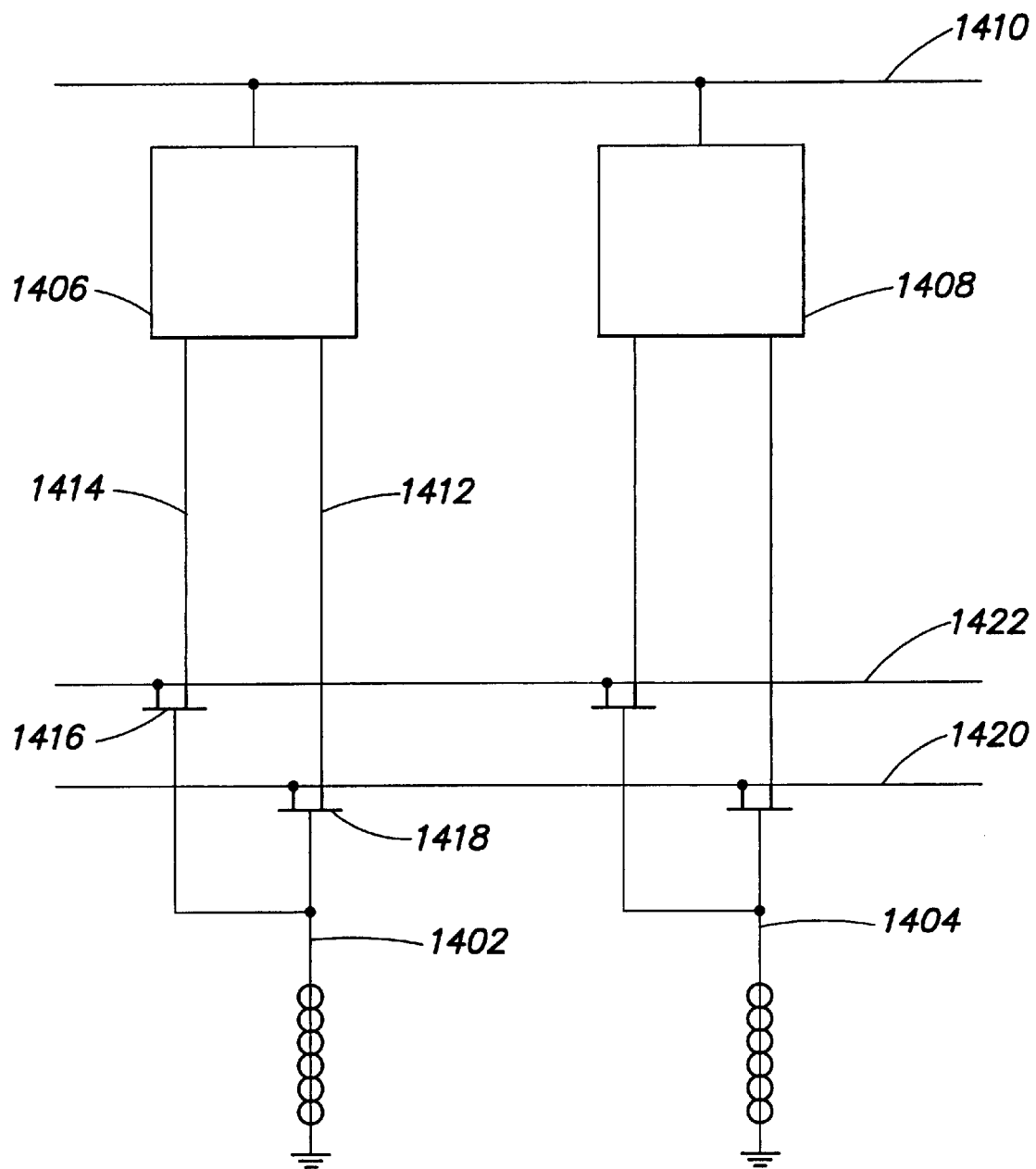
FIG. 14 is an embodiment of the present invention which utilizes flip-flops as the memory elements.

FIG. 14 shows another embodiment by which reading and writing may be effectuated. The embodiment of FIG. 14 includes first and second columns, 1402 and 1404, both of which may operate or be constructed according to any of the embodiments described above. The first column 1402 is coupled to a first flip-flop 1406 and the second column 1404 is coupled to a second flip-flop 1408. In this embodiment, the flip-flops 1406 and 1408 function as storage elements. That is, the flip-flops store the binary data bits associated with each column. The inputs 1412 and 1414 of the first flip flop 1406 may, respectively, be coupled through, for instance, first transistor 1418 and second transistor 1416 to a write line 1420 and a read/write line 1422. Both the transistors 1416 and 1418 may be coupled to the first column 1402. At least one output of the flip-flops may be coupled to a read-out layer 1410.

Figure 15:
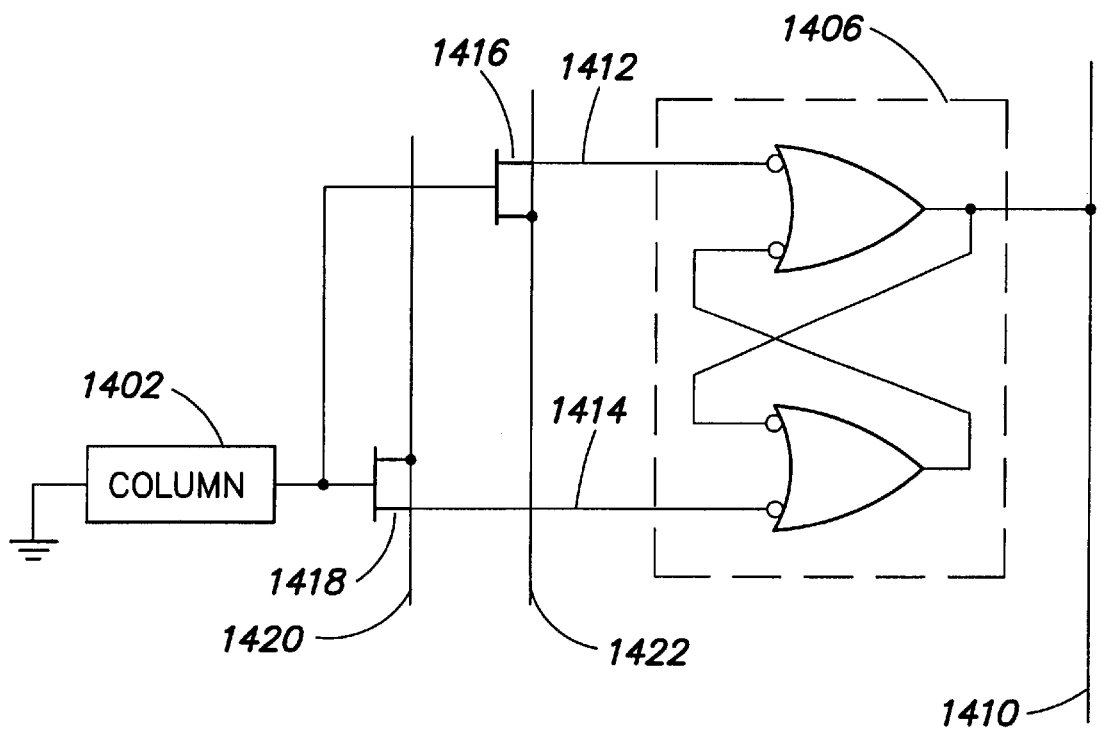
FIG. 15 is a more detailed view of a portion of the embodiment shown in FIG. 14.

FIG. 15 is a more detailed version of a portion of the embodiment of FIG. 14. Of course, the discussion related to the single column of FIG. 15 may apply to most or all of the columns in a memory device according to the teachings herein. In this example, the flip-flop 1406 is a "set-reset" type flip-flop, but other types of flip-flops could be used.

To read from the flip-flop 1406 via read-out line 1410, all that needs to be done (after the column 1402 is conductive) is to drive line 1422 to a high level while keeping line 1420 low. Similarly, to write to flip-flop 1406, line 1422 need only be placed in a low state.

Figure 16:
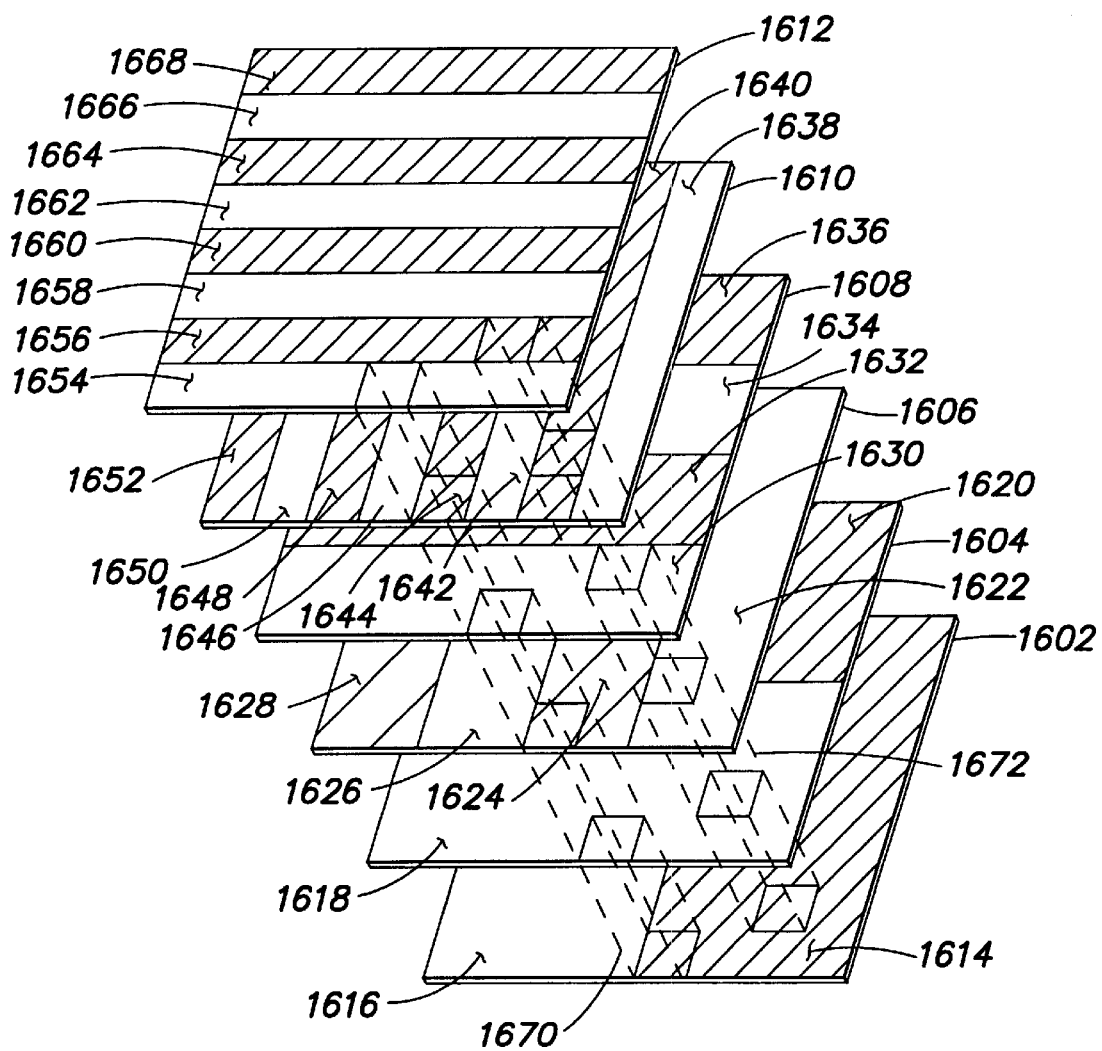
FIG. 16 is an exploded view of another embodiment of the present invention that, in some instances, may allow virtual columns to share addressable switch elements.

FIG. 16 shows an exploded view of yet another embodiment of the present invention. One distinguishing feature of this embodiment is that, in some instances, virtual columns may actually share addressable switch elements.

The embodiment shown includes six addressing layers, a first addressing layer 1602, a second addressing layer 1604, a third addressing layer 1606, a fourth addressing layer 1608, a fifth addressing layer 1610, and a sixth addressing layer 1612. The number of addressing layers in this embodiment is not limited to six and may include as few as two or as many as are needed to achieve the desired number of uniquely addressable locations.

Each layer is divided into a plurality of portions and each portion is responsive to one of two address signal values. The "portions" are similar to the addressable switch elements described above in that they only become conductive or enabled when they receive the correct input signal type.

Of course, the portions illustrated in FIG. 16 could be responsive to any type of input value. For example, the portions could be responsive to a voltage input value, different frequencies of light, or different frequencies of a.c. current.

In more detail, the first addressing layer 1602 is divided into a first portion 1614 and a second portion 1616, with the first portion 1614 being responsive to a first signal type and the second portion 1616 being responsive to a second signal type. For instance, the first portion 1614 could be responsive to an input value of 1 and the second portion responsive to an input value of 0.

For simplicity, as illustrated the "hatched" portions will be assumed to be responsive to a first signal type and the non-hatched portions responsive to a second signal type.

The second addressing layer 1604 is similarly divided into first and second portions 1618 and 1620, respectively. The second addressing layer 1604 may be arranged such that the portions thereof lie in a direction perpendicular to those of the first addressing layer 1602.

The third addressing layer 1606 is divided into four portions, 1622, 1624, 1626 and 1628. On the third addressing layer 1606, portions 1624 and 1628 are responsive to the first signal type and portions 1622 and 1626 are responsive to the second signal type. The fourth addressing layer 1608 is also divided into four portions, 1630, 1632, 1634 and 1636. The fourth layer 1608 may be arranged such that the portions thereof lie in a direction perpendicular to those of the third layer 1606.

The fifth addressing layer 1610 and the sixth addressing layer 1612 are divided into eight portions each, with the portions of the fifth addressing layer 1610 being perpendicular to the portions of the sixth addressing layer 1612. In particular, the fifth addressing layer 1610 includes portions 1638, 1640, 1642, 1644, 1646, 1648, 1650 and 1652 with portions 1640, 1644, 1648 and 1652 being responsive to the first signal type and portions 1638, 1642, 1646, and 1650 being responsive to the second signal type. The sixth addressing layer 1612 includes portions 1654, 1656, 1658, 1660, 1662, 1664, 1666 and 1668 with portions 1656, 1660, 1664 and 1668 being responsive to the first signal type and portions 1654, 1658, 1662, and 1666 being responsive to the second signal type.

Additional layers could be added with each grouping of two new layers being further subdivided and arranged as above. However, a new layer need not correspond and have perpendicular portions to the layer below. For instance, each layer could be subdivided into two times as many portions as the preceding layer.

The embodiment shown includes a first virtual column 1670 and a second virtual column 1672. Each virtual column includes six addressable switch elements formed from a portion of each addressing layer through which it passes. In particular, as shown, the first virtual column 1670 passes through portion 1614 of the first addressing layer 1602, portion 1618 of the second addressing layer 1604, portion 1624 of the third addressing layer 1606, portion 1630 of the fourth addressing layer 1608, portion 1644 of the fifth addressing layer 1610 and portion 1654 of the sixth addressing layer 1612. The second virtual column passes through portion 1614 of the first addressing layer 1602, portion 1618 of the second addressing layer 1604, portion 1622 of the third addressing layer 1606, portion 1630 of the fourth addressing layer 1608, portion 1640 of the fifth addressing layer 1610 and portion 1656 of the sixth addressing layer 1612.

The first virtual column 1670, assuming that the first signal type is a "1" and the second signal type is a "0" and that the first addressing layer 1602 is provided with the highest order address bit and the sixth addressing layer 1612 with the lowest order address bit, has an address of 101010 and the second virtual column has an address of 100011. The first virtual column 1670 and the second virtual column 1672 both have the highest order bit (i.e., their connection to the first layer 1672) that is responsive to the first signal type. This addressable switch element may thus be thought of as shared between the two virtual columns, 1670 and 1672.

The portions of each addressing layer may be formed in several different manners. For instance, each portion could be a single transistor or other device responsive to an electrical input. In embodiments utilizing optical addressing, each portion could be composed, for instance, of a material which passes light of a particular frequency.

In addition, if the embodiment of FIG. 16 is to be used in a memory device, each virtual column may be associated with a data storage element as described above.

Figure 17A:
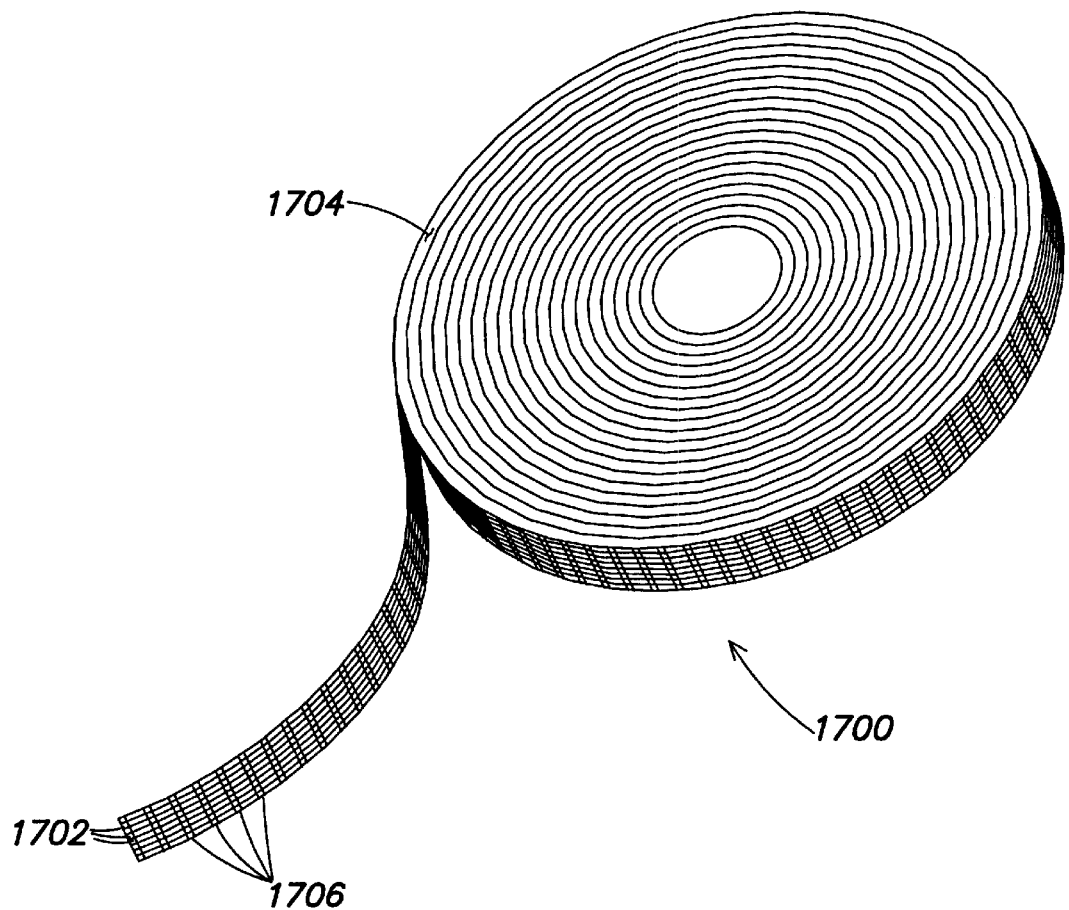
FIG. 17a is an example of one embodiment of the present invention implemented as a continuous spiral wind.
Figure 17B:
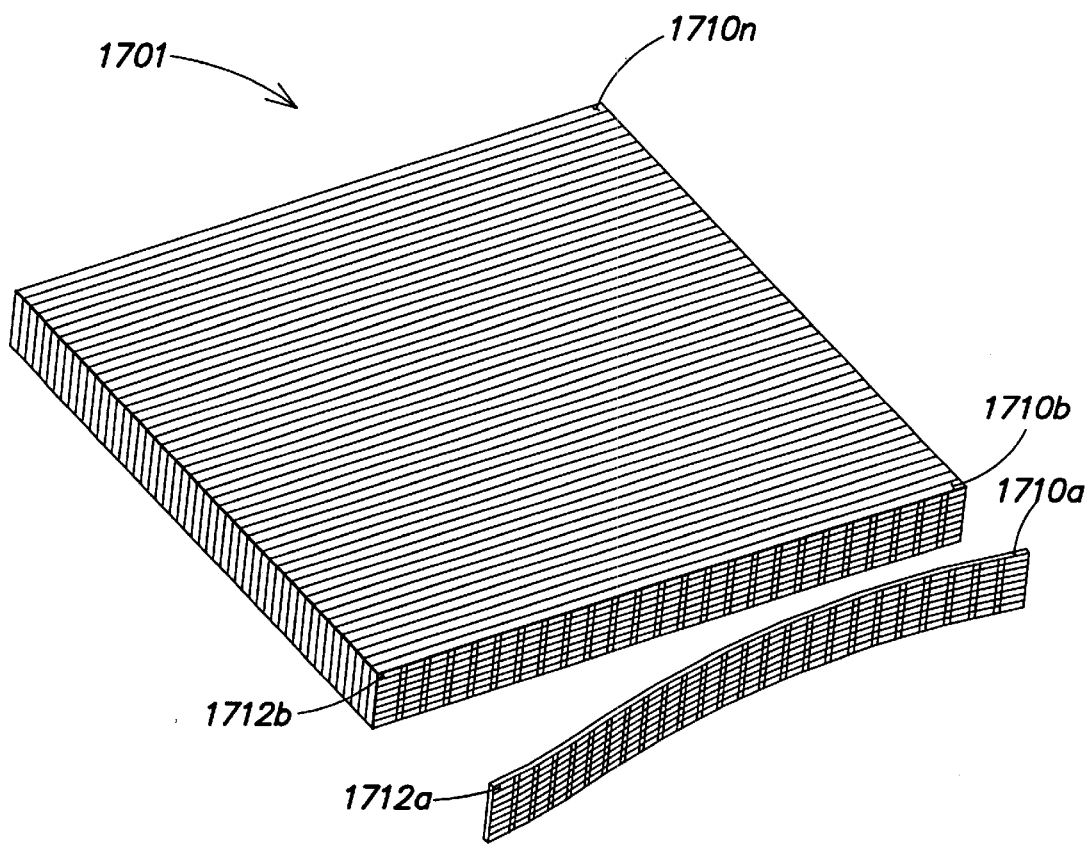
FIG. 17b is an embodiment of the present invention which includes several discrete portions of a memory device according to the present invention stacked together.

FIGS. 17a and 17b show alternative examples of how the present invention may be arranged. In these embodiments, the data storage device is constructed such that the addressing layers 1702 take the form of addressing lines laid down on a strip 1704. Thus, in this example, the addressing layers will be referred to as "addressing lines". Virtual columns 1706 are overlaid or otherwise disposed in contact with the addressing lines 1702.

FIG. 17a shows the strip 1704 as a continuous spiral wind 1700. The addressing lines 1702 may be laid on the strip 1704 over substantially the entire length of the strip 1704. The virtual columns 1706 overlie or otherwise contact the addressing lines such that the addressable switch elements contained therein are coupled to the addressing lines 1702. The general operation of this embodiment is the same or similar to that described above with each column 1706 having a unique address. The strip 1704 may be any type of material that insulates addressable elements (not shown) from other addressable elements as the strip is wound.

This embodiment lends itself to easy construction due to its linear design. For instance, as the addressing lines 1702 are being laid on the strip 1704, the virtual columns could be placed, printed, etc. immediately or soon thereafter and the strip 1704 rolled.

FIG. 17b shows another alternative embodiment of a data storage device 1701. In this embodiment, several discrete strips 1710a, 1710b . . . 1710n are placed together. Each discrete strip may include address lines and virtual columns arranged as described above. Each address line may be connected to all of the other lines that are on the same level. For instance, the top address line 1712a of the first strip 1710a may be connected to the top address line 1712b of strip 1710b. The connection may be through the strips by utilizing feed-throughs or via an external connection such as a wire or by direct contact and or subsequent fusion into a contiguous layer.

Figure 17C:
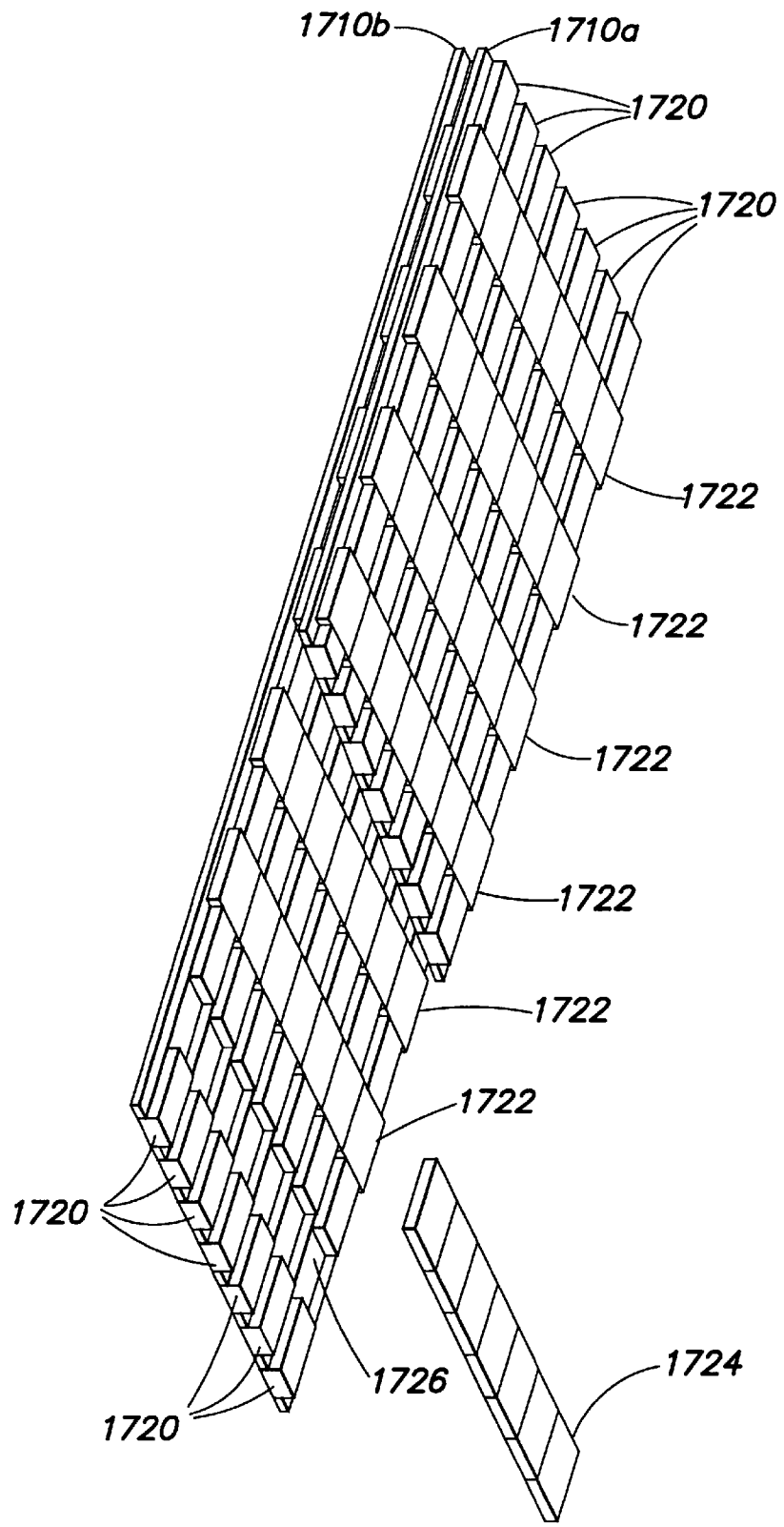
FIG. 17c is an exploded view of two of the strips of FIG. 17b (or overlapping portions of the spiral wind of FIG. 17a) illustrating one manner in which such strips may be constructed.

FIG. 17c is an exploded view of two strips, 1710a and 1710b, demonstrating one way in which the strips may be assembled to result in the topology of FIGS. 17a and 17b. The first strip 1710 b includes multiple address lines 1720. Interposed with and coupled to these address lines 1720 are virtual columns 1722. The unattached virtual column 1724 may be placed in the opening 1726. Of course, each virtual column need not be placed in an opening as illustrated in FIG. 17c. For example, the virtual columns 1722 could be placed on the strip first and the address lines 1720 could be added later or vice-versa.

Furthermore, the address lines of one layer strip may be interconnected to address lines of another layer to form a contiguous addressing layer.

Figure 18:
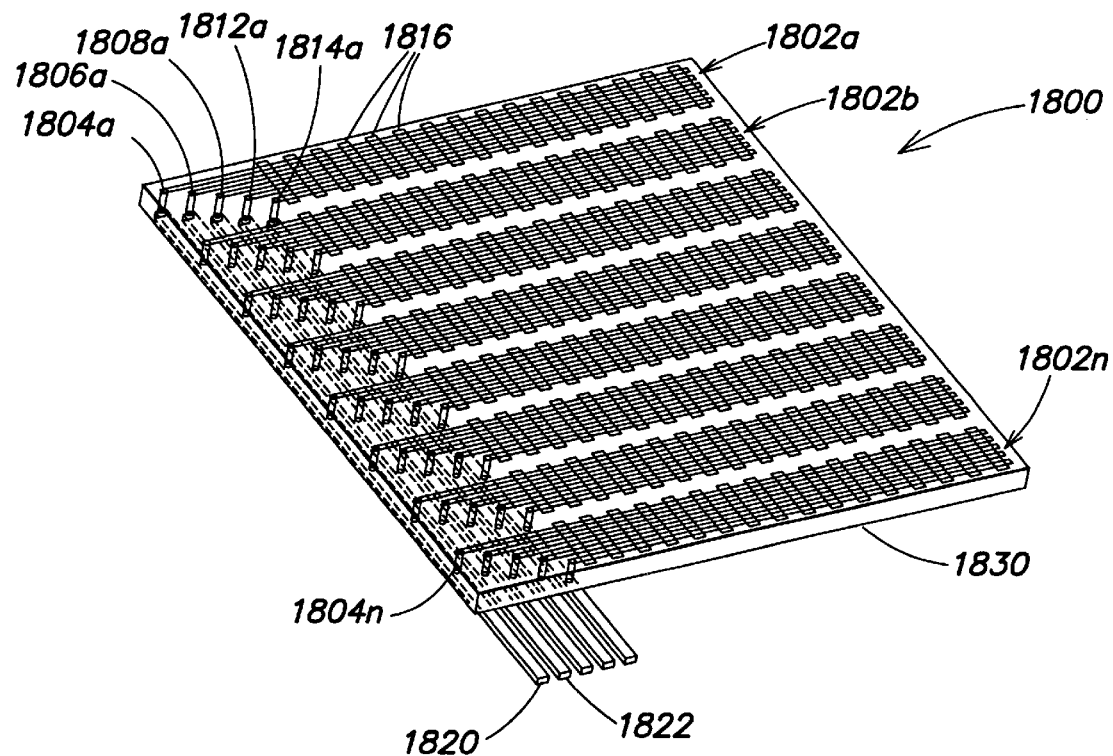
FIG. 18 is an example of a memory device according to the present invention divided into several sections.

FIG. 18 shows yet another alternative embodiment of a memory device 1800 according to aspects of the present invention. In this embodiment, the memory device 1800 is composed a plurality of sections 1802a, 1802b . . . 1802n.

Each section may include a plurality of address lines. For instance, section 1802a may include address lines 1804a, 1806a, 1808a, 1812a, and 1814a. Each of the address lines may be coupled to a plurality of virtual columns 1816. Each of these address lines is also coupled to a corresponding input address line. For instance, address line 1804a is coupled to input address line 1820 and address line 1806a is coupled to input address line 1822. The coupling may be a direct connection (i.e., the address line and the input address line are the same wire or other material) or via a feed-through that passes through the backing layer 1830 to couple the address line to the input address line.

The address lines of each section are each coupled to one of the input address lines as described above. For instance, address line 1804n of section 1802n is coupled to input address line 1820. In this manner, each address line that corresponds to the same level in each section is coupled to the same input address line. Thereby, the same address is presented to each section substantially simultaneously. Of course, the reading and writing to data storage elements (not shown) of each column may be accomplished using the techniques described above with the addition of read/write lines connected to the data storage elements.

In this embodiment, the virtual columns may be created on or in a substrate (for example, npn and pnp transistors on a silicon substrate) and the addressing lines are laid down perpendicular to the parallel columns in order to access the appropriate addressable switch elements (not shown). That is, the backing layer 1830 could be the substrate. However, as one of ordinary skill will readily realize, the address lines and virtual columns could be created and/or constructed in any of the manners disclosed herein. Of course, in other embodiments, the backing material 1830 could be an insulator onto which all components are placed.

Figure 19A:
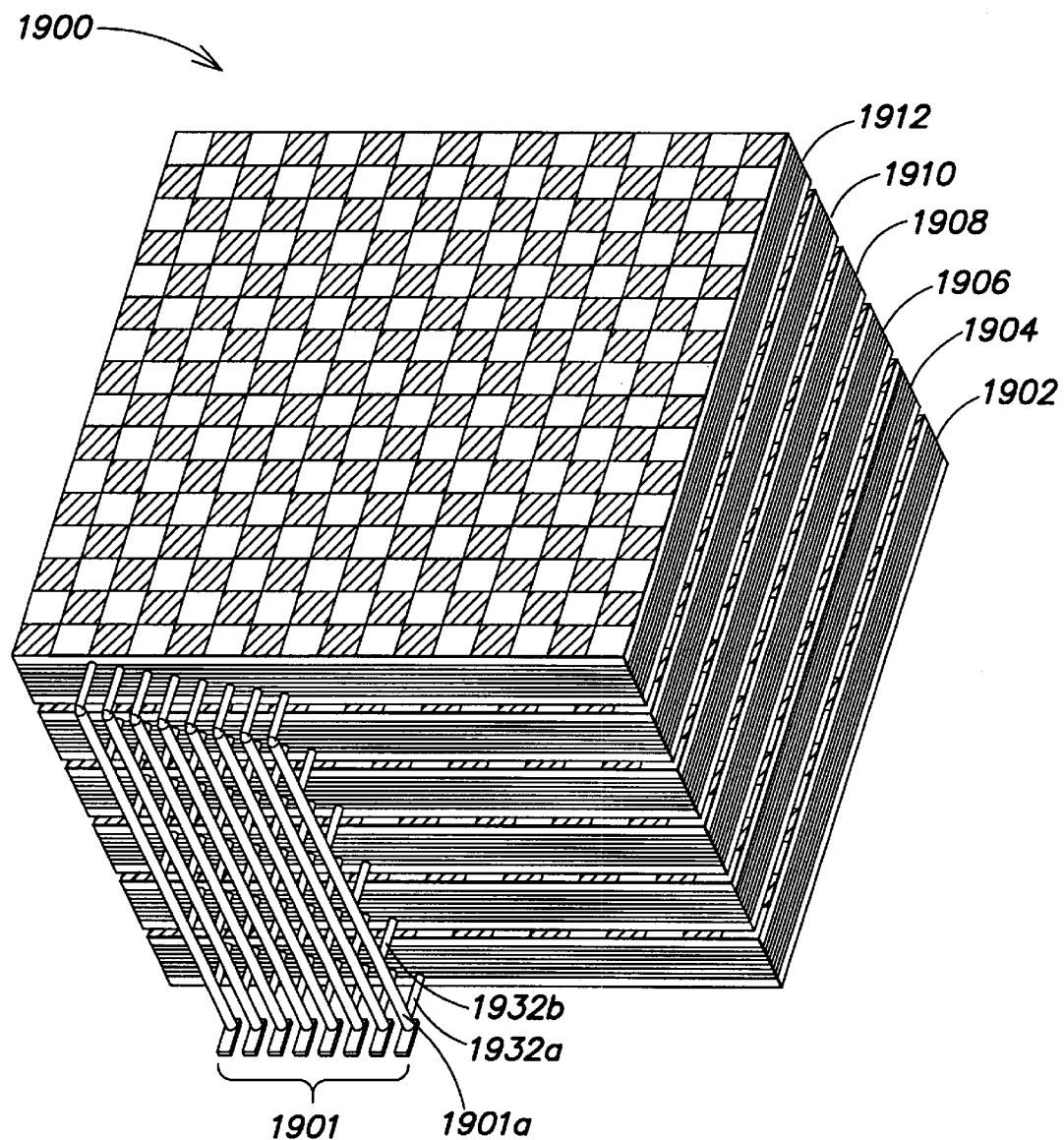
FIG. 19a shows a plurality of memory devices stacked on top of one another and connected to external bus bars.
Figure 19B:
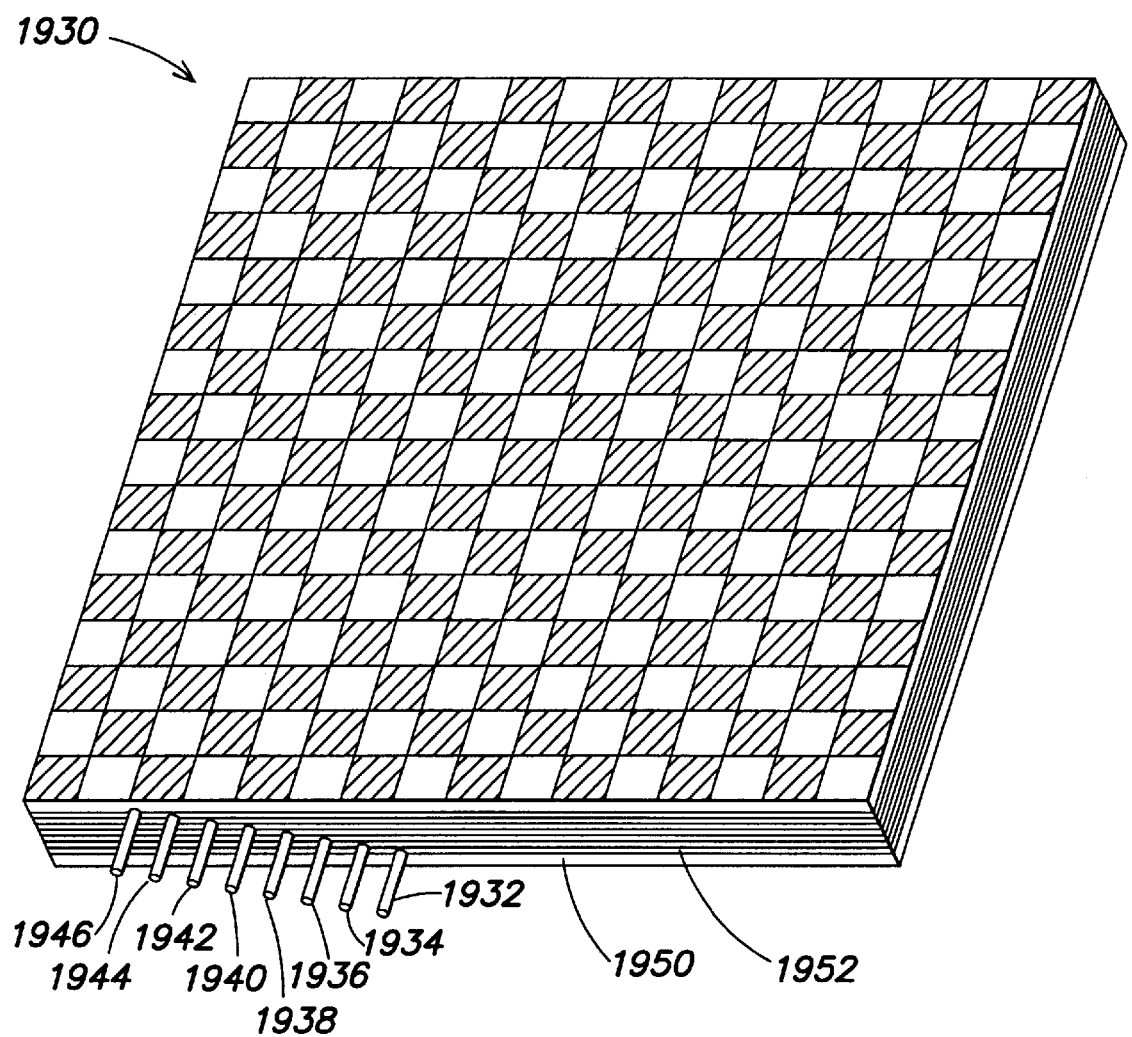

FIGS. 19a and 19b show another embodiment of a memory device 1900 according to the present invention. In particular, FIG. 19a shows several memory devices stacked together and connected via external access bus bars 1901. In the embodiment shown in FIG. 19a, six different memory devices are shown, first memory device 1902, second memory device 1904, third memory device 1906, fourth memory device 1908, fifth memory device 1910 and sixth memory device 1912. Each memory device may be constructed in any of the manners described above and the number of memory devices that may be combined is not limited by the embodiment shown.

Referring now to FIG. 19b, an example of a single memory device 1930 that may be utilized in the embodiment of FIG. 19a is shown. The memory device 1930 includes external layer access lines 1932, 1934, 1936, 1938, 1940, 1942, 1944, and 1946 that extend from each addressing layer of the memory device 1930. For instance, external layer access line 1932 extends from the lowest addressing layer 1950 and external layer access line 1934 extends from the second lowest addressing layer 1952. Of course the number of addressing layers is not limited to the number shown in FIG. 19b.

Referring back to FIG. 19a, each external layer access line is connected to a particular external bus bar 1901 (for clarity, only those external layer access lines discussed are labeled). Each of the external access bus bars 1901 is connected to an external access layer line that corresponds to the same address layer for every device. For instance, the external layer access line 1932a which is connected to the lowest layer of the first device 1902 is connected to the first external access bus bar 1901a. Similarly, the external layer access line 1932b which is connected to the lowest layer of the second device 1904 is connected to the first external access bus bar 1901a. The other external layer access lines are similarly connected such that every device has its corresponding address layer connected to the same external bus bar 1901.

The address desired is presented to the (in this example) base of the external bus bars and simultaneously reaches each memory device.

In this embodiment, the six memory devices 1902, 1904, 1906, 1908, 1910 and 1912 are stacked on top of one another. In operation, the six memory devices may be operated as a single device in at least two different ways. First, each memory device could hold, for example, a single bit of a word and when a particular address is accessed all of the bits could be simultaneously accessed. Alternatively, each memory device could contain a set of addresses that are different from every other device. In this embodiment, each device may not include the maximum number of address locations but rather only a portion thereof. This may be particularly useful when the cross-sectional area of the device is limited by external size constraints; instead of adding more columns horizontally displaced from one another to increase memory capacity, the columns are stacked on top of each other with each containing a portion of the total address space. Furthermore, even as memory cells become smaller, area constraints may still impose limits that may, in some instances only be overcome by stacking the memory devices as shown in FIG. 19a.

In the embodiments described in the foregoing discussion, all switching signals delivered to the addressable switch elements have been enabling signals for turning the switches to an enabled state and allowing conduction of a transverse signal through a particular virtual column. Conversely, signals and addressable switch elements may be utilized in a manner such that all of the switch elements are normally in the enable state, and the virtual column is thus, conductive, until one of the switch element is not in the conductive or enabled state. Addressing may be thought of in this manner as "shutting off" all of the columns except the desired column. This is yet another way that the unique addressing of a particular virtual column according to aspects of the present invention may be accomplished.

Figure 20:
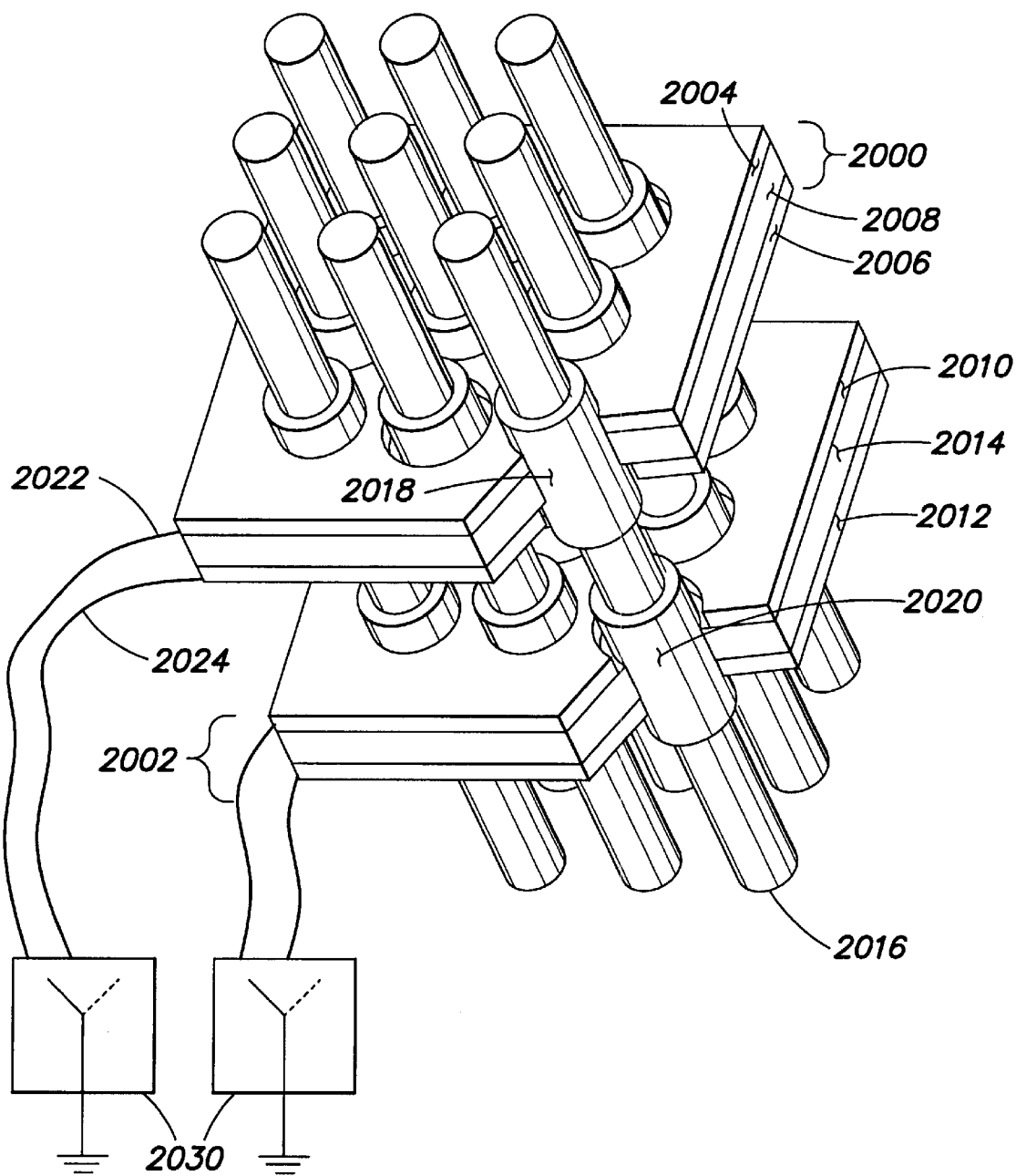
FIG. 20 shows a plurality of virtual columns passing through addressing layers which are constructed such that the addressable switch element performs a column disabling as opposed to a column enabling function when the appropriate signal is applied thereto.

FIG. 20 shows an example embodiment where each virtual column may be addressed when all of the addressable switch elements associated therewith are in an enabled state and addressing is accomplished by "turning off" one or more of the addressable switch elements in all columns other than the one being addressed. Namely, in the embodiment of FIG. 20, a virtual column is uniquely addressed (e.g., enabled) if it is the only virtual column with all of its addressable switch elements remaining in the enabled state after the address has been applied to the elements. This may be accomplished in one embodiment, by routing the signal passing through the virtual column through a more easily passed route, e.g., through an addressing layer.

In general, this embodiment works by causing an addressable switch element to enter a disabled state when there is an alternative path through an addressing layer more preferable than that through the virtual column.

In the embodiment of FIG. 20, the first addressing layer 2000 and the second addressing layer 2002 both include two conductive sheets separated by an isolating layer. That is, the first addressing layer 2000 includes a first conductive sheet 2004 and a second conductive sheet 2006 separated by isolating layer 2008 and the second addressing layer 2002 includes a third conductive sheet 2010 and a fourth conductive sheet 2012 separated by isolation layer 2014.

The first virtual column 2016 includes a first addressable switch element 2018 and a second addressable switch element 2020. In this embodiment, the virtual column (e.g., column 2016) may be composed of a conductive material of intermediate conductivity such as graphite or other resistive composition or of metallic material of higher conductivity such as aluminum, copper, silver, or gold.

To actuate an addressable switch element responsive to a first signal, one of the two conductive layers is connected to ground. For instance, addressing lines 2022 and 2024 may, respectively, couple the first conductive sheet 2004 or the second conductive sheet 2006 to ground.

In this embodiment, each addressable switch element is coupled to one of the two conductive sheets of one addressing layer. For instance, a first addressable switch element 2018 may be coupled to the first conductive layer 2004 and not coupled to the second conductive layer 2006.

One of the two conductive layers may be selected via a selector 2030. This selector may be implemented in any manner such that a particular conductive layer may be coupled to ground or V+. For instance, each selector 2030 could be similar to the signal distributor detailed above with respect to FIG. 11 such that a selected layer is coupled to ground. However, unlike the embodiment of FIG. 11, a low or ground signal rather than a high signal may be placed on the desired line.

After the conductive layer has been coupled to ground, the signal passing through the column (e.g., first column 2016) is coupled to ground and does not pass to the end of the virtual column. In this manner, if only one addressable switch element of the virtual column is grounded, the column is "non-conductive" and thereby not selected.

Many of the foregoing embodiments of memory devices have included the use of virtual columns. The columns were typically associated with a data storage element. However, it should be recognized that these virtual columns may be applicable in other applications that do not require a data storage element as well. For instance, the columnar addressing techniques described herein could be applied to applications such as video displays which are "real time" and therefore do not require data storage at all thus, removing any need for read/write lines or refresh operations. Other applications may include, but are not limited to, video imaging systems, sensor arrays, and logical processors.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A data storage device, comprising:
   at least one addressing layer; and
   at least one virtual column having at least one data storage element and a plurality of addressable switch elements, wherein the at least one virtual column is coupled to the at least one addressing layer such that at least one of the plurality of addressable switch elements is in a conductive relationship with the at least one addressing layer.

2. The data storage device of claim 1, wherein each addressable switch element receives a signal from each a different one of the at least one addressing layers.

3. The data storage device of claim 2, wherein each of the addressable switch elements is one of two possible types, the first type allowing for conduction through the addressable switch element only upon receipt of an input of a first type, the second type allowing for conduction through the addressable switch element only upon receipt of an input of a second type.

4. The data storage device of claim 3, wherein the plurality of addressable switch elements are coupled to a different one of the at least one addressable switch elements.

5. The data storage device of claim 4, wherein the virtual column is only conductive when each addressable switch element of the virtual column receives an input of the type that allows for conduction through the addressable switch element.

6. The data storage device of claim 4, wherein the at least one addressable switch element receives an input of either the first type or the second type from one of the addressing layers.

7. The data storage device of claim 6, wherein the at least one addressable switch element responds to electrical signals.

8. The data storage device of claim 6, wherein the at least one addressable switch element responds to optical signals.

9. The data storage device of claim 1, further comprising a read layer.

10. The data storage device of claim 1, further comprising a write layer.

11. The data storage device of claim 1, wherein each addressing layer is composed of an electrical conductor.

12. The data storage device of claim 1, wherein each addressing layer is composed of an optical conductor.

13. The data storage device of claim 1, further comprising:
    a read out layer coupled to a portion of the at least one virtual column; and
    a sensor that senses a signal placed on the read out layer.

14. The data storage device of claim 13, wherein reading from the data storage element via the read out layer may only be performed when the virtual column is in an enabled state.

15. The data storage device of claim 14, wherein the plurality of addressable switch elements control when the virtual column is in the enabled state.

16. The data storage device of claim 13, wherein each addressable switch element is one of only two possible types, the first type allowing for conduction through the addressable switch element only upon receipt of an input of a first type, the second type allowing for conduction through the addressable switch element only upon receipt of an input of a second type.

17. The data storage device of claim 16, wherein the virtual column is only conductive when each addressable switch element receives an input of the type that allows for conduction through the addressable switch element.

18. The data storage device of claim 17, wherein the at least one addressable switch element responds to electrical signals.

19. The data storage device of claim 17, wherein the at least one addressable switch element responds to optical signals.

20. The data storage device of claim 17, wherein the at least one addressing layer is composed of an electrical conductor.

21. The data storage device of claim 17, wherein the at least one addressing layer is composed of an optical conductor.

22. A device for storing data comprising:
- at least one virtual column;
- at least one read layer coupled to a first portion of the virtual column; and
- at least one addressing layer coupled to a second portion of the virtual column.

23. The device of claim 22, wherein the at least one virtual column is disposed through the at least one read layer and the at least one addressing layer.

24. The device of claim 22, wherein the first portion of the virtual column is different than the second portion of the virtual column.

25. The device of claim 22, wherein the virtual column includes:
- at least one data storage element; and
- at least one addressable switch element.

26. The device of claim 25, wherein the at least one data storage element is coupled to the at least one read layer and the at least one addressable switch element is coupled to the at least one addressing layer.

27. The device of claim 25, further comprising at least one write layer coupled to the at least one data storage element.

28. The device of claim 25, wherein each of the at least one addressable switch elements is one of only two possible types, the first type allowing a signal to pass through the addressable switch element only upon receipt of an input of a first type, the second type allowing for a signal to pass through the addressable switch element only upon receipt of an input of a second type.

29. The device of claim 25, wherein the virtual column is only in an enabled state when each of the at least one addressable switch elements of the virtual column receives an input of the type that allows for transmission through the addressable switch element.

30. The device of claim 25, wherein the at least one virtual column includes a plurality of addressable switch elements, and wherein the plurality of addressable switch elements receive an input of either the first type or the second type from one of the at least one addressing layers.

31. The device of claim 25, further comprising:
- a plurality of virtual columns, each virtual column including a first addressable switch element and a second addressable switch element;
- a first addressing layer coupled to the first addressable switch element of each column; and
- a second addressing layer coupled to the second addressable switch element of each column.

32. The device of claim 25, wherein the at least one addressable switch element responds to electrical signals.

33. The device of claim 25, wherein the at least one addressable switch element responds to optical signals.

34. The device of claim 25, wherein the at least one virtual column includes a plurality of addressable switch elements and wherein the device further includes:
- a plurality of addressing layers, at least two of which are coupled to two of the plurality of addressable switch elements of the virtual column.

35. A data storage device comprising a plurality of virtual columns, each of the virtual columns including an addressable switch element and a data storage element; and, surrounding the addressable switch element, a material adapted to transmit a signal to the addressable switch element.

36. The data storage device of claim 35, wherein the plurality of virtual columns are arranged such that the material surrounding the addressable switch element of at least one of the plurality of virtual column contacts the material surrounding the addressable switch element of at least one other virtual column of the plurality of virtual columns to form an addressing layer.

37. The data storage device of claim 36, wherein the material that surrounds each addressable switch element is adapted to transmit optical signals.

38. The data storage device of claim 36, wherein the material that surrounds each addressable switch element is adapted to transmit electrical signals.

39. A data storage device comprising:
- a plurality of memory devices, each containing data storage elements, configured such that each data storage element contained in each memory device is accessible for read/write operations by presenting an address of the data storage element to a plurality of laminar layers contained in the device, each memory device including a plurality of external access lines associated with a respective one of the plurality of laminar layers; and
- a plurality of external bus bars, each external bus bar being associated with at least one of the plurality of external access lines.

40. A memory device comprising:
- a first strip of non-conductive material; and
- a first plurality of virtual columns disposed on the first strip.

41. The memory device of claim 40, wherein at least one of the plurality of virtual columns includes a plurality of addressable switch elements.

42. The memory device of claim 41, further comprising a plurality of address lines disposed on the first strip, and wherein the addressable switch elements of each virtual column are coupled to at least one of the address lines.

43. The memory device of claim 41, wherein the virtual column is only conductive when each addressable switch element of the virtual column receives an input of the type that allows for conduction through the addressable switch element.

44. The memory device of claim 43, wherein the at least one addressable switch element receives an input of either the first type or the second type from one of the address lines.

45. The memory device of claim 42, wherein each address line is composed of an electrical conductor.

46. The memory device of claim 42, wherein each address line is composed of an optical conductor.

47. The memory device of claim 41, wherein reading or writing from a data storage element may only be performed when the virtual column is in a conductive state.

48. The memory device of claim 41, wherein the plurality of addressable switch elements control when the virtual column is conductive.

49. The memory device of claim 41, wherein the addressable switch elements are one of two possible types, the first type allowing for conduction through the addressable switch element only upon receipt of an input of a first type, the second type allowing for conduction through the addressable switch element only upon receipt of an input of a second type.

50. The memory device of claim 41, wherein the at least one addressable switch element responds to electrical signals.

51. The memory device of claim 41, wherein the at least one addressable switch element responds to optical signals.

52. The memory device of claim 40, further comprising a read layer.

53. The memory device of claim 40, further comprising a write layer.

54. The memory device of claim 40, further comprising:

a second strip of non-conductive material; and a second plurality of virtual columns disposed on the second strip;

wherein the second strip is disposed over the first strip.

55. The memory device of claim 54, further comprising a plurality of external address lines coupled to both the first and second strips of non-conductive material.

56. A memory device comprising:

a substrate;

a plurality of virtual columns arranged into sections on the substrate, each section including a plurality of address lines coupled to portions of the virtual columns; and a plurality of external access lines coupled to the address lines.

57. A method of accessing data in a data storage device having a plurality of address layers, comprising the steps of:

(a) determining an address of a data bit to be accessed; and (b) applying a voltage to the plurality of address layers, wherein the voltage applied to the plurality of address layers corresponds to a logic state of a particular bit expressed by a binary representation of the address.

58. The method of claim 57, further comprising a step of accessing information stored in a data storage element associated with a plurality of addressable switch elements, wherein the addressable switch elements are coupled to the address layers.

59. The method of claim 57, further comprising a step of placing information on a write layer.

60. The method of claim 59, further comprising a step of storing the information placed on the write layer in a data storage element associated with binary representation of the address.

* * * * *